US012622031B2

(12) United States Patent
Liaw

(10) Patent No.: US 12,622,031 B2
(45) Date of Patent: May 5, 2026

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 662 days.

(21) Appl. No.: 17/726,984

(22) Filed: Apr. 22, 2022

(65) Prior Publication Data

US 2023/0261090 A1     Aug. 17, 2023

Related U.S. Application Data

(60) Provisional application No. 63/309,971, filed on Feb. 14, 2022.

(51) Int. Cl.
| | |
|---|---|
| *H10D 64/01* | (2025.01) |
| *H10D 30/01* | (2025.01) |
| *H10D 30/67* | (2025.01) |
| *H10D 62/13* | (2025.01) |
| *H10D 84/85* | (2025.01) |

(52) U.S. Cl.
CPC ......... *H10D 64/018* (2025.01); *H10D 30/031* (2025.01); *H10D 30/6735* (2025.01); *H10D 30/6757* (2025.01); *H10D 62/151* (2025.01); *H10D 84/85* (2025.01); *H10D 64/017* (2025.01)

(58) Field of Classification Search
CPC ......... H01L 29/42392; H01L 29/78696; H01L 29/66545; H01L 29/66439; H10D 64/018
See application file for complete search history.

(56) References Cited

U.S. PATENT DOCUMENTS

| | | | | |
|---|---|---|---|---|
| 11,189,705 B2 * | 11/2021 | Wong | ..................... | B82Y 10/00 |
| 11,610,977 B2 * | 3/2023 | Huang | ............. | H01L 29/66553 |
| 11,728,402 B2 * | 8/2023 | Liaw | ................. | H01L 29/66545 |
| | | | | 257/369 |
| 2017/0110554 A1 | 4/2017 | Tak et al. | | |

(Continued)

*Primary Examiner* — Bitew A Dinke
(74) *Attorney, Agent, or Firm* — HAYNES AND BOONE, LLP

(57) ABSTRACT

In a method of manufacturing a semiconductor device, a fin structure in which first semiconductor layers and second semiconductor layers are alternately stacked over a bottom fin structure protruding from a substrate, is formed. A sacrificial gate structure is formed over the fin structure. A source/drain region of the fin structure is etched, thereby forming a source/drain space. The first semiconductor layers are laterally etched through the source/drain space. An inner spacer is formed on an end of each of the etched first semiconductor layers. One or more epitaxial layers are formed in the source/drain space, and the sacrificial gate structure is replaced with a metal gate structure. A width of the source/drain space at a bottommost one of the first semiconductor layers is greater than a width of the source/drain space at one of the first semiconductor layers above the bottommost one of the first semiconductor layers.

20 Claims, 16 Drawing Sheets

(56)              References Cited

U.S. PATENT DOCUMENTS

| | | | |
|---|---|---|---|
| 2017/0256609 | A1* | 9/2017 | Bhuwalka ......... H01L 29/78696 |
| 2018/0301531 | A1* | 10/2018 | Xie ................... H01L 21/02532 |
| 2019/0067441 | A1* | 2/2019 | Yang ................. H01L 29/4908 |
| 2019/0081155 | A1* | 3/2019 | Xie ................... H01L 29/66553 |
| 2019/0096996 | A1* | 3/2019 | Song ................. H01L 21/3081 |
| 2019/0131431 | A1* | 5/2019 | Cheng .............. H01L 29/66439 |
| 2019/0165157 | A1* | 5/2019 | Yang ................. H10D 30/6735 |
| 2019/0172751 | A1* | 6/2019 | Smith ................ H01L 27/0924 |
| 2019/0295889 | A1* | 9/2019 | Bai .................... H10D 30/6219 |
| 2019/0305106 | A1* | 10/2019 | Bi ..................... H10D 30/6212 |
| 2020/0035676 | A1* | 1/2020 | Wang ................. H01L 29/785 |
| 2020/0044087 | A1* | 2/2020 | Guha .............. H01L 21/823821 |
| 2020/0075718 | A1* | 3/2020 | Wang ................. H10D 64/512 |
| 2020/0411530 | A1* | 12/2020 | Wong ................ H01L 29/0673 |
| 2021/0036122 | A1* | 2/2021 | Wong ................... B82Y 10/00 |
| 2021/0066294 | A1* | 3/2021 | Huang ............. H01L 29/66818 |
| 2021/0083046 | A1* | 3/2021 | Lin ................... H01L 21/76897 |
| 2021/0098627 | A1* | 4/2021 | Liaw ................... H01L 29/775 |
| 2021/0118884 | A1* | 4/2021 | Liaw ................... H10D 30/014 |
| 2021/0126134 | A1* | 4/2021 | Ferng .............. H01L 21/30604 |
| 2021/0126135 | A1* | 4/2021 | Lee ................... H01L 29/66545 |
| 2021/0135011 | A1* | 5/2021 | Ju ...................... H01L 29/7849 |
| 2021/0210613 | A1* | 7/2021 | Cho .................... H10D 64/017 |
| 2021/0226066 | A1* | 7/2021 | Young ................ H01L 29/7848 |
| 2021/0265349 | A1 | 8/2021 | Chung et al. |
| 2021/0273047 | A1* | 9/2021 | Kuan ............... H01L 29/66553 |
| 2021/0343853 | A1* | 11/2021 | Chung .............. H01L 29/41791 |
| 2021/0351303 | A1* | 11/2021 | Ju ..................... H01L 21/76897 |
| 2022/0238723 | A1* | 7/2022 | Jeong ................ H01L 29/0673 |
| 2022/0344484 | A1* | 10/2022 | Pao .................. H01L 29/42376 |
| 2023/0023711 | A1* | 1/2023 | Choi ................... H10D 62/151 |
| 2023/0142410 | A1* | 5/2023 | Frougier .......... H01L 29/42392 |
| | | | 257/288 |

* cited by examiner

Cross-section C2
PMOSFET

Cross-section C1
NMOSFET

Cross-section C2
PMOSFET

45
G3
LDD region
G4'
11
75S
50P
84P
90 82
90
95
75D
50P
50P
25
10
S3
S3
S4
D1
11
G4

Cross-section C1
NMOSFET

G1
G2'
D1
11
70S
50N
84N
90
95
75D
50N
50N
25
10
45
S1
S1
S2
11
LDD region
84N
82
75S
50N
G2

X
Z

Cross-section C4
Cell X pitch

APT & Well regions (formed by multiple implant): boron or BF2

100D

75D

75D

50P

50N

N-Well 12N

P-Well 12P

95

15

10

APT & Wells region (formed by multiple implant): phosphorus or arsenic

Z

Y

METHOD OF MANUFACTURING A SEMICONDUCTOR DEVICE AND A SEMICONDUCTOR DEVICE

RELATED APPLICATION

This application claims priority to U.S. Provisional Application No. 63/309,971 filed Feb. 14, 2022, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a cross sectional view along the X direction (source-to-drain direction) corresponding to line C1 of FIG. 1, FIG. 2B is a cross sectional view along the X direction corresponding to line C2 of FIG. 1, FIG. 2C is a cross sectional view along the Y direction corresponding to line C3 of FIG. 1 and FIG. 2D shows a cross sectional view along the Y direction corresponding to line C4 of FIG. 1.

FIG. 3A is a cross sectional view along the X direction (source-to-drain direction) corresponding to line C1 of FIG. 1, FIG. 3B is a cross sectional view along the X direction corresponding to line C2 of FIG. 1, FIG. 3C is a cross sectional view along the Y direction corresponding to line C3 of 1 and FIG. 3D shows a cross sectional view along the Y direction corresponding to line C4 of FIG. 1.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. Material, configuration, dimensions and/or processes explained with one embodiment may be employed in other embodiments, and detailed explanation thereof may be omitted. In this disclosure, a source/drain refers to a source and/or a drain. It is noted that in the present disclosure, a source and a drain are interchangeably used, and the structures thereof are substantially the same.

The present disclosure is generally related to a gate-all-around (GAA) FET, in particular, a GAA FET having vertically stacked multiple channels that are horizontally extending nanosheets or nanowires (nano structures).

Figure 1:
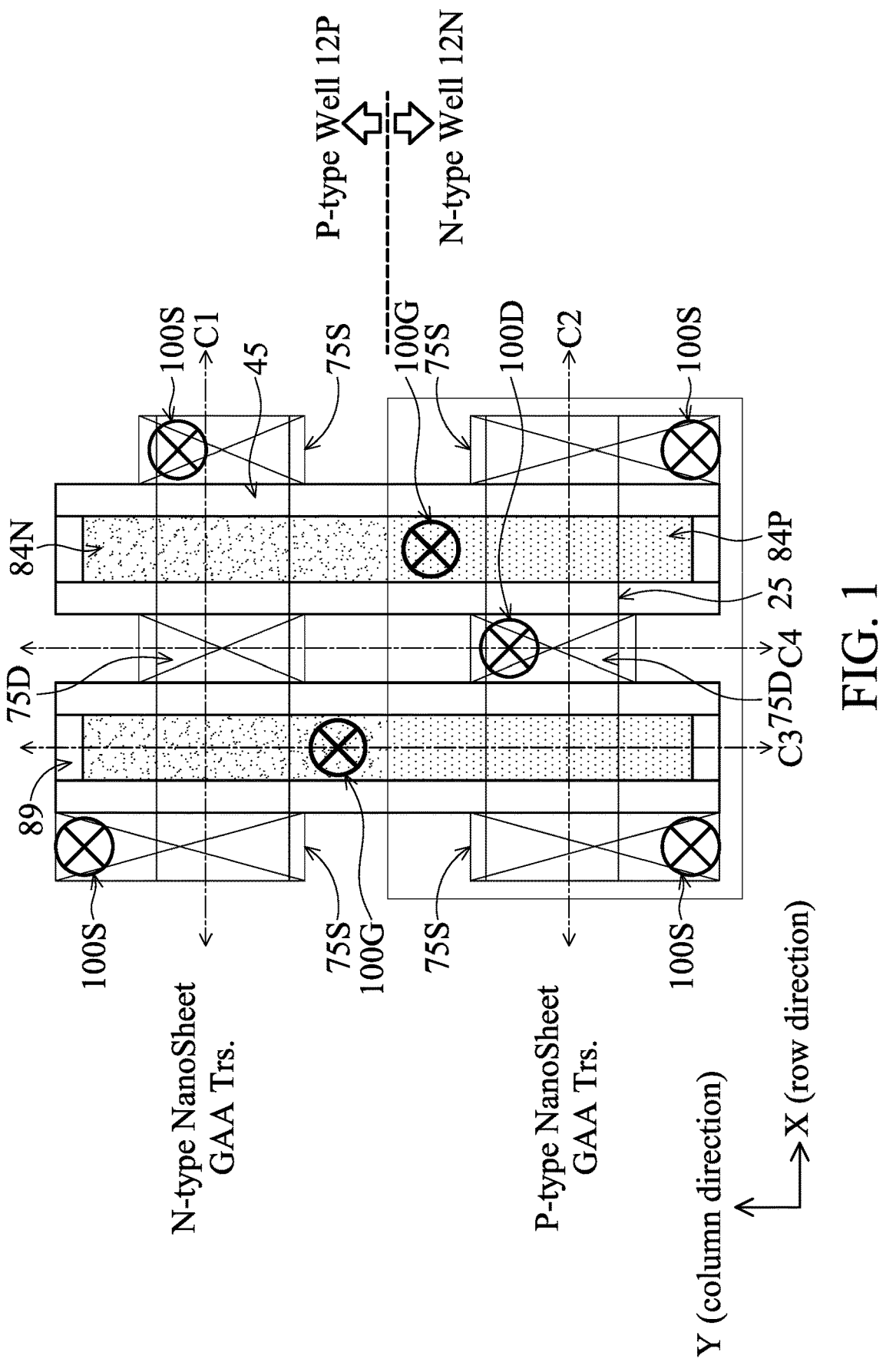
FIG. 1 shows a plan view (layout view) of a semiconductor device including one or more GAA FET devices according to an embodiment of the present disclosure.

FIG. 1 shows a plan view (layout view) of a semiconductor device including one or more GAA FET devices according to an embodiment of the present disclosure. In some embodiments, the GAA FET device is a complementary metal-oxide-semiconductor (CMOS) device. In some embodiments, the semiconductor device includes one or more N-type GAA FET device (NMOS or NFET) disposed over a p-type well region 12P and one or more P-type GAA FET devices (PMOS or PFET) disposed over an n-type well region 12N.

As shown in FIG. 1, each of the N-type GAA device and the P-type GAA device includes stacked channel regions 25 including two or more vertically arranged semiconductor nanosheets or nanowires. A gate structure including a gate dielectric layer and a gate electrode layer is commonly disposed over the channel regions 25 of the N-type GAA FET and the P-type GAA FET. In some embodiments, the gate electrode layer includes an n-type gate electrode layer 84N for the N-type GAA FET and a p-type gate electrode layer 84P for the P-type GAA FET. In some embodiments, gate sidewall spacers 45 are formed around the gate electrode and a gate end dielectric layers 89 are disposed at both ends of the gate electrode. The N-type GAA FET further includes source/drain epitaxial layers, a source contact 75S disposed over a source epitaxial layer and a drain contact 75D disposed over a drain epitaxial layer. Further, an upper source contact 100S is disposed over the source contact 75S, an upper drain contact 100D is disposed over the drain contact 75D and a gate contact 100G is disposed over the gate electrode.

Figure 2B:
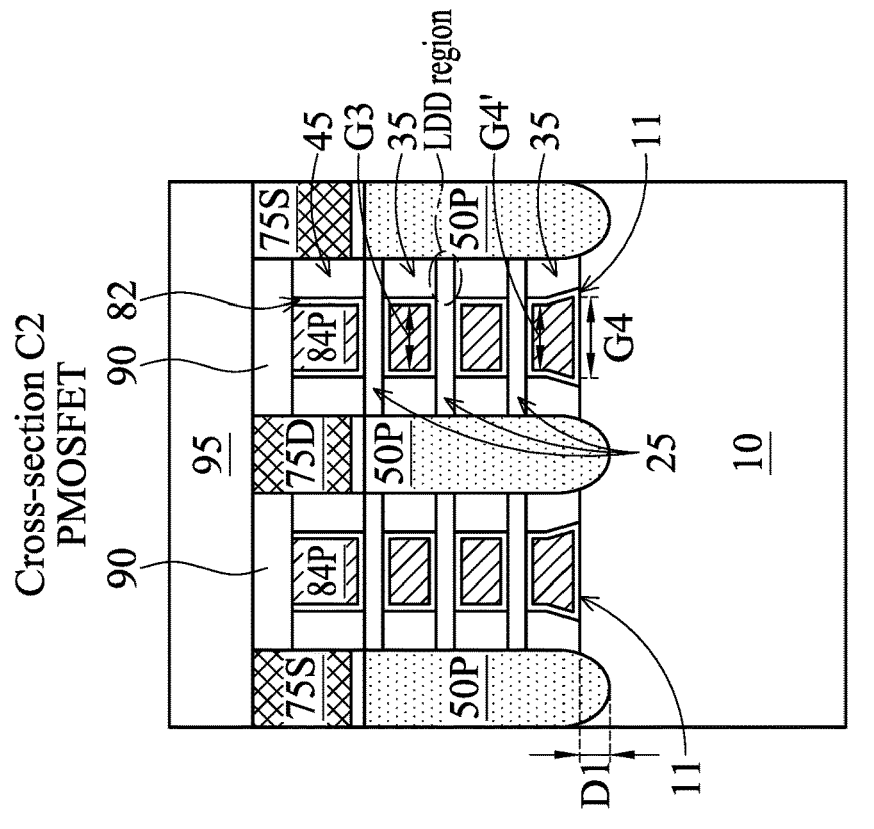
FIGS. 2A, 2B, 2C and 2D show various views of a GAA FET device according to an embodiment of the present disclosure.
Figure 2A:
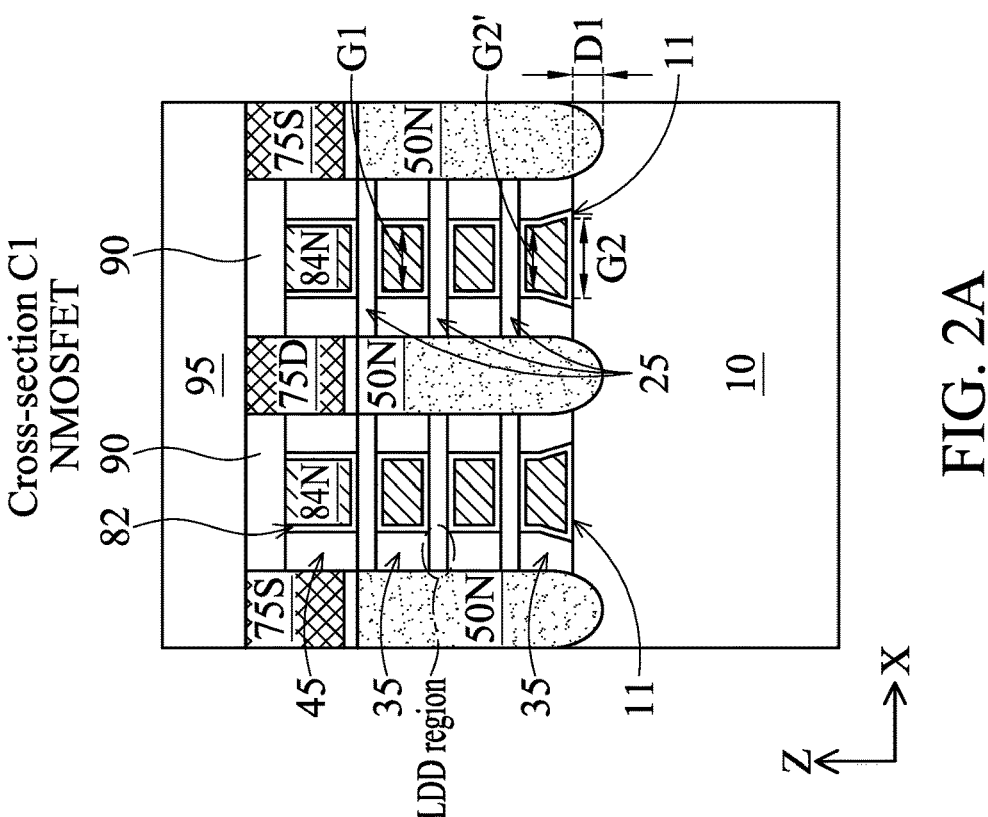
Figure 2C:
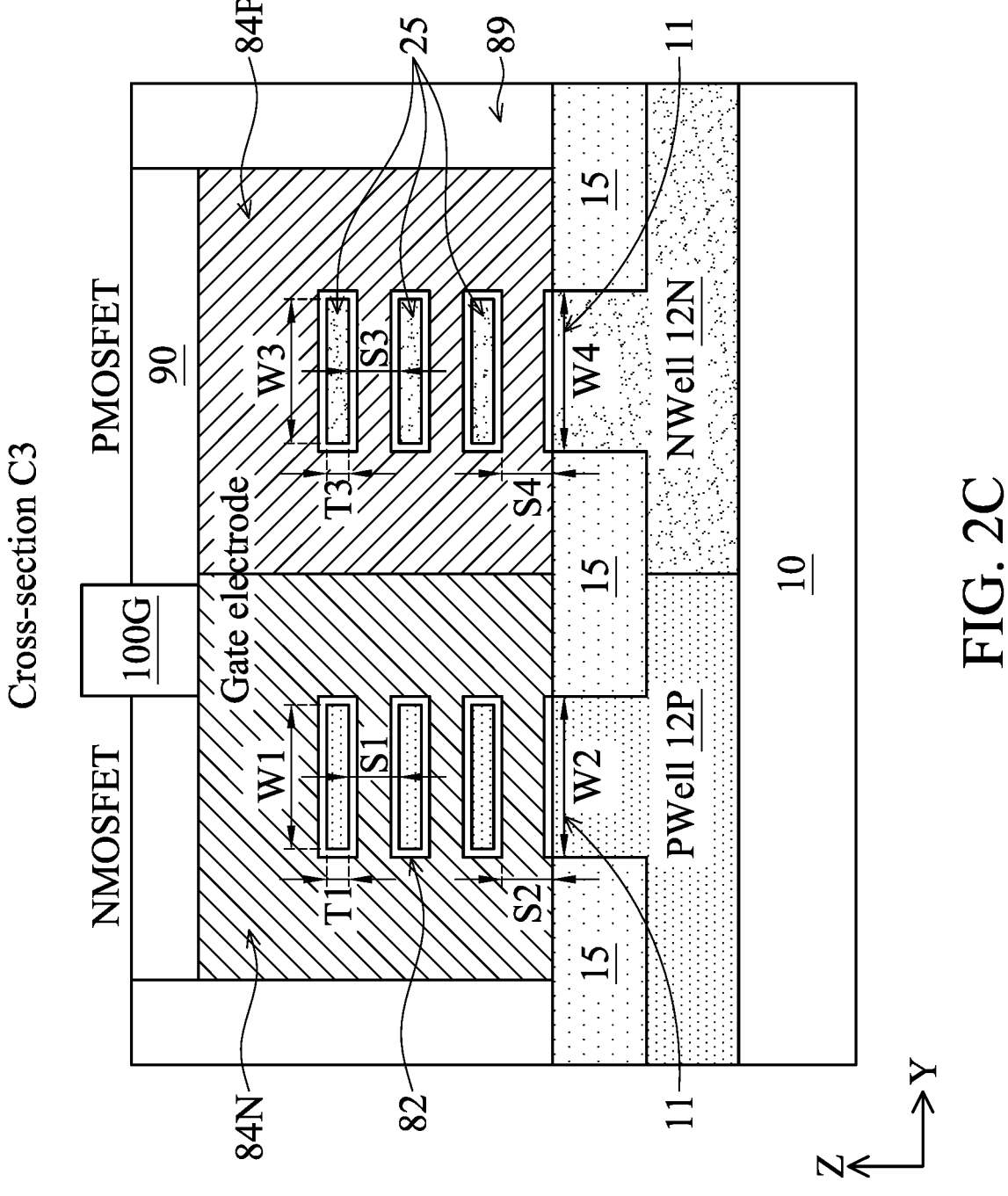
Figure 2D:
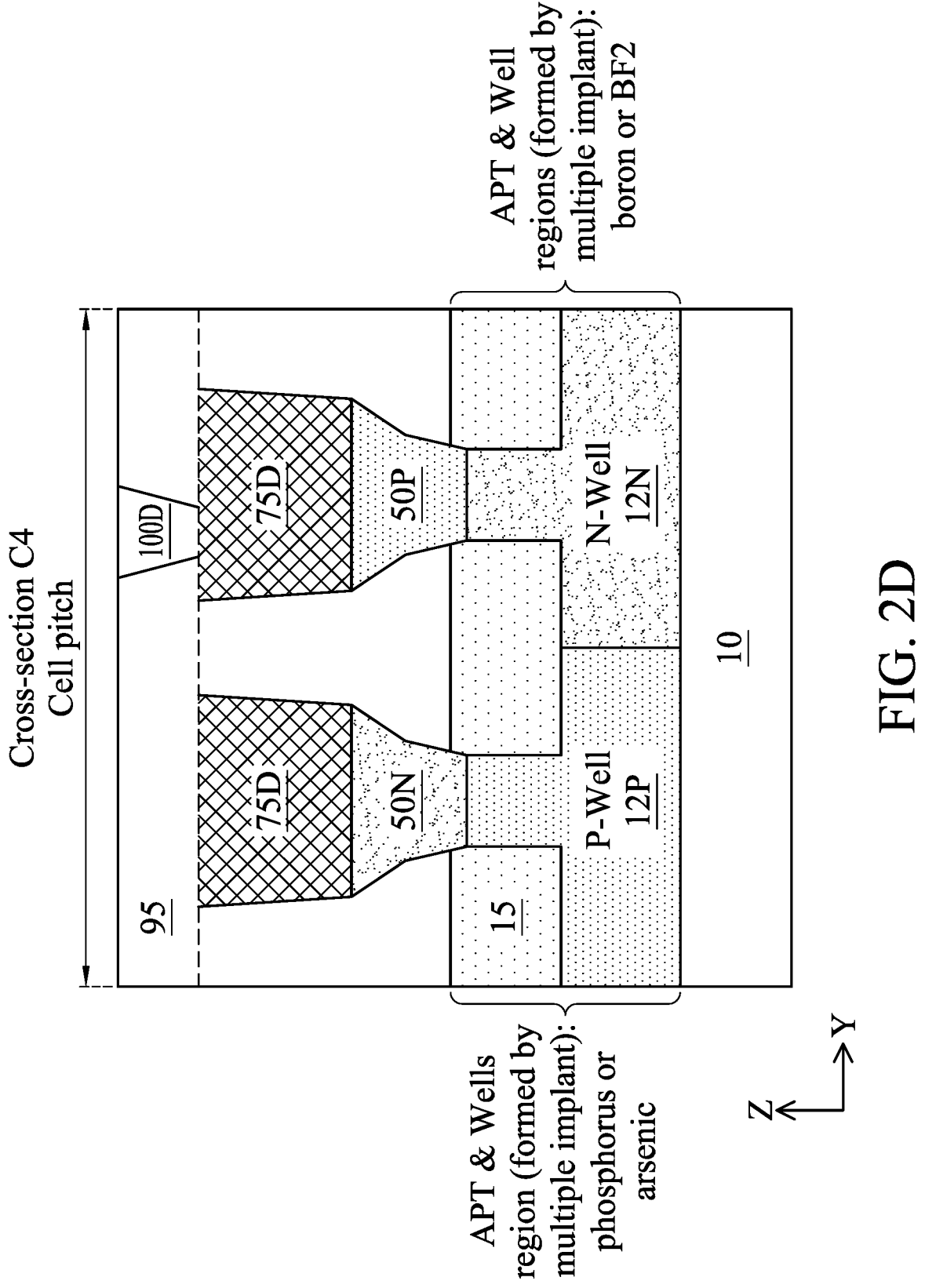

FIGS. 2A, 2B, 2C and 2D show various views of a GAA FET device according to an embodiment of the present disclosure. FIG. 2A is a cross sectional view along the X direction (source-to-drain direction) corresponding to line C1 of FIG. 1, FIG. 2B is a cross sectional view along the X direction corresponding to line C2 of FIG. 1, FIG. 2C is a cross sectional view along the Y direction corresponding to line C3 of FIG. 1 and FIG. 2D shows a cross sectional view along the Y direction corresponding to line C4 of FIG. 1.

As shown in FIGS. 2A-2D, semiconductor nanowires or nanosheets 25 are disposed over a semiconductor substrate 10, and vertically arranged along the Z direction (the normal direction to the principal surface of the substrate 10). In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si. In some embodiments, the channel regions 25 for an n-type GAA FET is non-doped or doped with P and/or As, and the channel regions 25 for a p-type GAA FET is non-doped or doped with B.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 2A-2D, the semiconductor nanosheets or wires 25, which are channel layers, are disposed over a bottom fin structure protruding from the substrate 10. Each of the channel regions 25 is wrapped around by a gate dielectric layer 82 and a gate electrode layer 84N or 84P. The thickness of the semiconductor nanosheets or nanowires 25 is in a range from about 2 nm to about 20 nm and the width of the semiconductor nanosheets or nanowires 25 is in a range from about 5 nm to about 50 nm in some embodiments, depending on the design and/or process requirements. In some embodiments, the semiconductor device includes a core logic region and a input-output (I/O) region, and the GAA FETs in the I/O region have a thicker gate dielectric layer than the GAA FETs in the core logic region, with a difference in a range from about 0.5 nm to about 3 nm. In some embodiments, the GAA FETs in the I/O region have a larger gate pitch (e.g., about 1.4 times to about 20 times) than the GAA FETs in the core logic region, depending on the design and/or process requirements.

In some embodiments, the width of the semiconductor nanowires or nanosheets is greater than the thickness. In certain embodiments, the width is up to twice or five times the thickness of the semiconductor nanowires or nanosheets 25. Although FIGS. 2A-2D show three semiconductor nanosheets or nanowires 25, the number of the semiconductor nanosheets or nanowires 25 is not limited to three, and may be as small as one or more than three, and may be up to ten. By adjusting the number of the semiconductor nanosheets or nanowires, a driving current of the GAA FET device can be adjusted. In some embodiments, the pitch of the nanosheets or nanowires in the vertical direction is in a range from about 12 nm to about 24 nm, depending on the design and/or process requirements.

In some embodiments, an interfacial dielectric layer 81 (see, FIG. 17C) is formed between the channel regions 25 and the gate dielectric layer 82. In some embodiments, the gate dielectric layer 82 includes one or more layers of a dielectric material, such as silicon oxide, silicon nitride, or a high-k dielectric (e.g., $k \geq 9$ or $k \geq 13$) material, other suitable dielectric material, and/or combinations thereof. Examples of high-k dielectric material include $HfO_2$, $HfSiO$, $HfSiON$, $HfTaO$, $HfTIO$, $HfZrO$, zirconium oxide, aluminum oxide, titanium oxide, tantalum oxide, hafnium dioxide-alumina ($HfO_2$—$Al_2O_3$) alloy, other suitable high-k dielectric materials, and/or combinations thereof. In some embodiments, the gate dielectric layer 82 includes one or more elements such as La, Lu, Sc, Sr, Ce, Y, Dy, Eu and Yb. In some embodiments, the thickness of the gate dielectric layer 82 is in a range from about 0.5 nm to about 3 nm, depending on the design and/or process requirements.

In some embodiments, the gate electrode layer is disposed over the gate dielectric layer and includes one or more conductive layers. In some embodiments, the gate electrode layer includes a barrier layer, an adhesion layer, a work function adjustment material (WFM) layer, a glue layer, and/or a body metal layer. In some embodiments, the barrier layer, the adhesion layer and/or the glue layer include TiN, TaN, Ti or Ta. In some embodiments, the WFM layer includes one or more layers. The WFM layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-type GAA FET, one or more of TaN, TaAlC, TiN, TiC, Co, TiAl, HfTi, TiSi and TaSi is used as the WFM layer in the gate electrode 84N, and for the p-type GAA FET, one or more of TiAlC, Al, TiAl, TaN, TaAlC, TiN, TiC and Co is used as the WFM layer in the gate electrode 84P. The body metal layer includes one or more of W, Co, Ni, Mo, Ru or any other suitable materials. In some embodiments, at least one of the WFM layers is continuous between the n-type GAA FET and the p-type GAA FET and at least one of the WFM layer is discontinuous between the n-type GAA FET and the p-type GAA FET. In some embodiments, the body metal layer is continuous between the n-type GAA FET and the p-type GAA FET.

In some embodiments, the gate sidewall spacers 45 include one or more layer of dielectric material, such as silicon oxide, silicon nitride, SiOC, SiON, SiOCN, SiCN, porous oxide or any other suitable dielectric materials. In some embodiments, a gate cap insulating layer 90 is disposed over the gate electrode and includes one or more layers of silicon oxide, silicon nitride, SiOC, SiON, SiOCN, SiCN, porous oxide or any other suitable dielectric materials.

Further, a source/drain epitaxial layer 50N, 50P is disposed over the substrate 10 and connected to the channel regions 25. The source/drain epitaxial layer 50N for the N-type GAA FET includes one or more layers of SiP, SiCP, SiC, SiCAs, SiAs and SiAsP, and the source/drain epitaxial layer 50P for the P-type GAA FET includes one or more layers of Si, SiGe, Ge, SiGeSn or GeSn, and further includes boron (B) and/or carbon (C) in some embodiments.

In some embodiments, the source/drain epitaxial layer 50N includes a first epitaxial layer and a second epitaxial layer having a different P (and/or As) concentration. In some embodiments, the amount of P (and/or As) is in a range from about $1\times10^{20}$ atoms·cm$^{-3}$ to about $1\times10^{21}$ atoms·cm$^{-3}$, and is in a range from about $2\times10^{20}$ atoms·cm$^{-3}$ to about $6\times10^{20}$ atoms·cm$^{-3}$ in other embodiments. In some embodiments, the amount of P (and/or As) in the second epitaxial layer is greater than the amount of P in the first epitaxial layer. The amount of P in the second epitaxial layer is in a range from about $1\times10^{21}$ atoms·cm$^{-3}$ to about $5\times10^{21}$ atoms·cm$^{-3}$ in some embodiments, and is in a range from about $2\times10^{21}$ atoms·cm$^{-3}$ to about $4\times10^{21}$ atoms·cm$^{-3}$ in other embodiments.

In other embodiments, the source/drain epitaxial layer 50P includes a first epitaxial layer and a second epitaxial layer having a different Ge (and/or B) concentration. In some embodiments, a germanium amount of the second epitaxial layer is greater than a germanium amount of the first epitaxial layer. In some embodiments, the Ge amount of the first epitaxial layer is in a range from about 20 atomic % to 40 atomic % and the Ge amount of the second epitaxial layer is in a range from about 35 atomic % to about 50 atomic %. In some embodiments, the SiGe epitaxial layers contain boron as dopant. In some embodiments, a boron concentration of the second epitaxial layer is greater than a boron concentration of the first epitaxial layer. The amount of B in the first epitaxial layer 64 is in a range from about $1\times10^{20}$ atoms·cm$^{-3}$ to about $5\times10^{20}$ atoms·cm$^{-3}$, and the amount of B in the second epitaxial layer is in a range from about $5\times10^{20}$ atoms·cm$^{-3}$ to about $1\times10^{21}$ atoms·cm$^{-3}$ in other embodiments.

The source/drain epitaxial layer 50N, 50P is in direct contact with a lightly-doped-drain (LDD) region of each of the channel regions 25, and extends into the bottom fin structure by an amount D1 of about 5 nm to about 35 nm in some embodiments. In some embodiments, the bottom fin structure protrudes from the substrate 10 and is embedded in an isolation insulating layer 15, such as shallow trench isolation (STI). In some embodiments, a bottom of the source/drain epitaxial layer 50N, 50P has a rounded shape (e.g., U-shape) or a tapered shape, in which the width of the epitaxial layer decreases toward the substrate. Such a rounded shape can maintain an isolation margin between the source/drain epitaxial layer and the gate structure.

The source/drain epitaxial layer 50N, 50P is separated by insulating inner spacers 35 and the gate dielectric layer 82 from the gate electrode layer 84N, 84P. In some embodiments, the inner spacers 35 include one or more dielectric layers such as silicon oxide, SiON, SiOC, SiOCN or any other suitable dielectric material. In some embodiments, the inner spacers include an air gap. In some embodiments, the dielectric constant of the inner spacers 35 is greater than the dielectric constant of the gate sidewall spacers 45. In some embodiments, the thickness (vertical height) of the gate sidewall spacers 45 is greater than the thickness (vertical height) of the inner spacers 35 by an amount, for example, of about 0.5 nm to about 3 nm. In some embodiments, the thickness (horizontal width) of the gate sidewall spacer 45 is in a range from about 3 nm to about 12 nm, and the thickness (horizontal width) of the inner spacer 35 is in a range from about 3 nm to about 12 nm, depending on the design and/or process requirements.

In some embodiments, the source contact 75S and the drain contact 75D include one or more of Co, Ni, W. Ti, Ta, Cu, Al, TiN and TaN. Further, the upper source contact 100S, the upper drain contact 100D and the gate contact 100G includes one or more layers of Ru, Co, Ni, W. Ti, Ta, Cu, Al, TiN and TaN. In some embodiments, a silicide layer, such as WSi, NiSi, TiSi or CoSi or other suitable silicide material or an alloy of a metal element and silicon and/or germanium is disposed between the source/drain epitaxial layer and the source/drain contact.

As shown in FIGS. 2A and 2B, in some embodiments, a planer channel region 11 (planar FET portion) is disposed below the nanosheet or nanowire channel regions 25. In some embodiments, the gate structure contacting the planar channel region 11 has a tapered shape (trapezoidal) in the cross section. In some embodiments, the trapezoidal or tapered gate electrode has an upper width (G1) smaller than the bottom width (G2), which is about 1.01 times to about 1.5 times the upper width.

In some embodiments, the channel length G2 of the planar channel region 11 (without the gate dielectric layer) is greater than the channel length G1 of the nanosheet or nanowire channel regions 25 (without the gate dielectric layer). In some embodiments, G2/G1 is in a range from about 1.01 to about 1.6 and in a range from about 1.05 to about 1.4 in other embodiments. Generally, a longer Lg (gate length) is beneficial for short-channel control of the bottom planar channel. To suppress the short channel leakage, the channel length G2 should be as larger as possible. However, considering the finer device size (e.g., a gate pitch), an upper limit for the channel length G2 is set to maintain an isolation margin between a gate electrode and a source/drain epitaxial layer. The foregoing ranges can satisfy both the above requirements above. In some embodiments, G2/G1 is about 1.05 to 1.15. As set forth above, the larger G2 can reduce an off-current of the GAA FET, while the smaller G1 can improve device performance (e.g., speed) and reduce the device size. In some embodiments, the upper width of the trapezoidal or tapered gate electrode G2' for both the planar channel 11 and the bottommost one of the nanosheets or nanowires 25 is equal to or greater than the width G1 and smaller than G2. In some embodiments, G2/G2' is in a range from about 1.05 to about 1.3. In some embodiments, G1 is in a range from about 5 nm to about 20 nm, and G2 is in a range from about 6 nm to about 24 nm, depending on the design and/or process requirements.

In some embodiments, as shown in FIG. 2C, the width W1 of the channel regions 25 of the N-type GAA FET is equal to or smaller than the width W3 of the channel regions 25 of the P-type GAA FET. In some embodiments, W1/W3 is in a range from about 0.7 to about 1.0 and in other embodiments is in a range from about 0.8 to about 0.95. When the ratio is greater than these ranges, it may be difficult to balance an on-current between the N-type FET and the P-type FET. In some embodiments, the thickness T1 of the channel regions 25 of the N-type GAA FET is equal to the thickness T3 of the channel regions 25 of the P-type GAA FET.

In some embodiments, the width W2 of the planar channel region 11 of the N-type GAA FET is equal to or greater than the width W1 of the channel regions 25, and the width W4 of the planar channel region 11 of the P-type GAA FET is equal to or greater than the width W3 of the channel regions 25.

In some embodiments, the space S1 between adjacent channel regions 25 (without gate dielectric layer) of the N-type GAA FET is equal to the space S3 between adjacent channel regions 25 (without gate dielectric layer) of the P-type GAA FET. In some embodiments, the space S1 is equal to the space S2 between the bottommost channel region 25 and the planar channel region 11 (without gate dielectric layer) of the N-type GAA FET, and the space S3 is equal to the space S4 between the bottommost channel region 25 and the planar channel region 11 (without gate dielectric layer) of the P-type GAA FET. In some embodiments, S1 and S2 are in a range from about 6 nm to about 16 nm, depending on the design and/or process requirements.

In some embodiments, the p-type well region 12P and the n-type well region 12N shown in FIG. 2D are formed by multiple ion implantation processes. In some embodiments, the implantation process includes an anti-punch-through (APT) implantation process. In some embodiments, the n-type well region 12N is formed by implanting P and/or As, and the p-type well region 12P is formed by implanting B or BF$_2$. In some embodiments, the dopant concentration in the well regions is in a range from about $1\times10^{19}$ atoms·cm$^{-3}$ to about $1\times10^{21}$ atoms·cm$^{-3}$. The dopant concentration of the well regions is greater (e.g., 10-1000 times) than the dopant concentration of the nanosheet or nanowire channel regions 25.

Figures 3A, 3B:
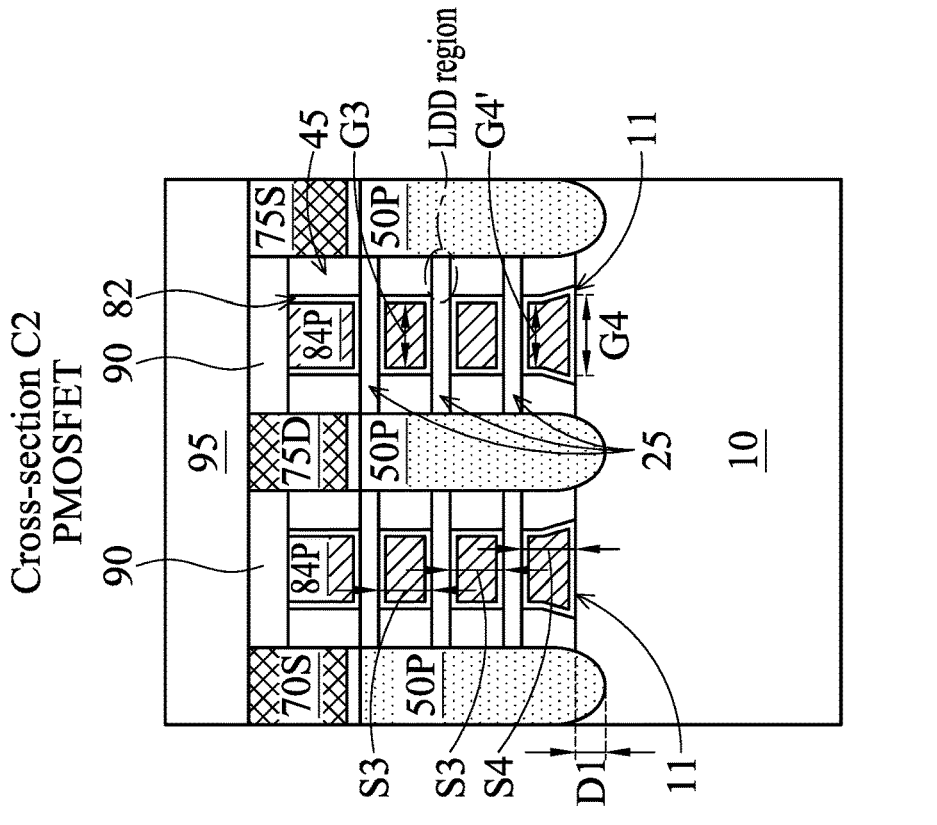
FIGS. 3A, 3B, 3C and 3D show various views of a GAA FET device according to an embodiment of the present disclosure.
Figure 3C:
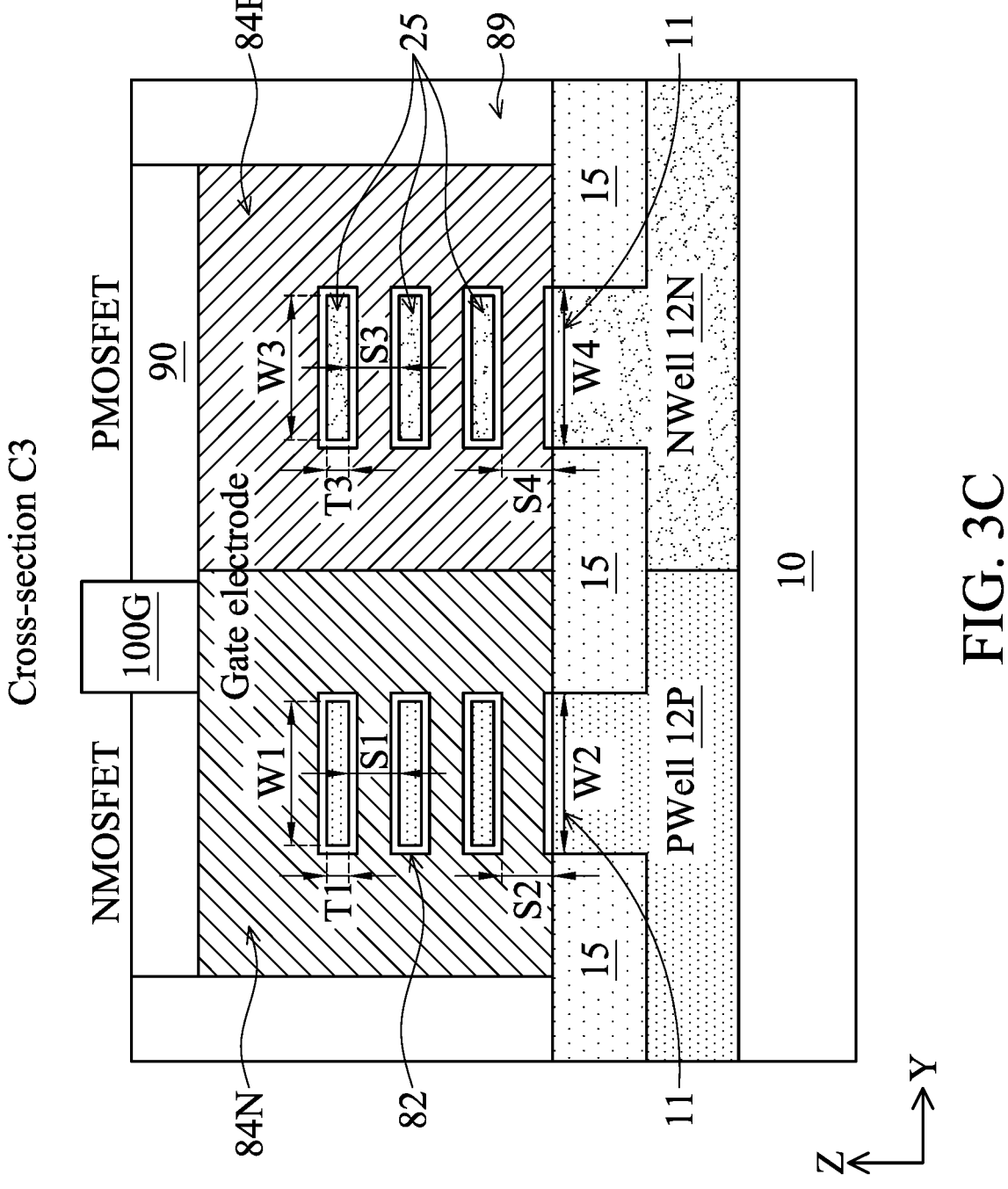
Figure 3D:
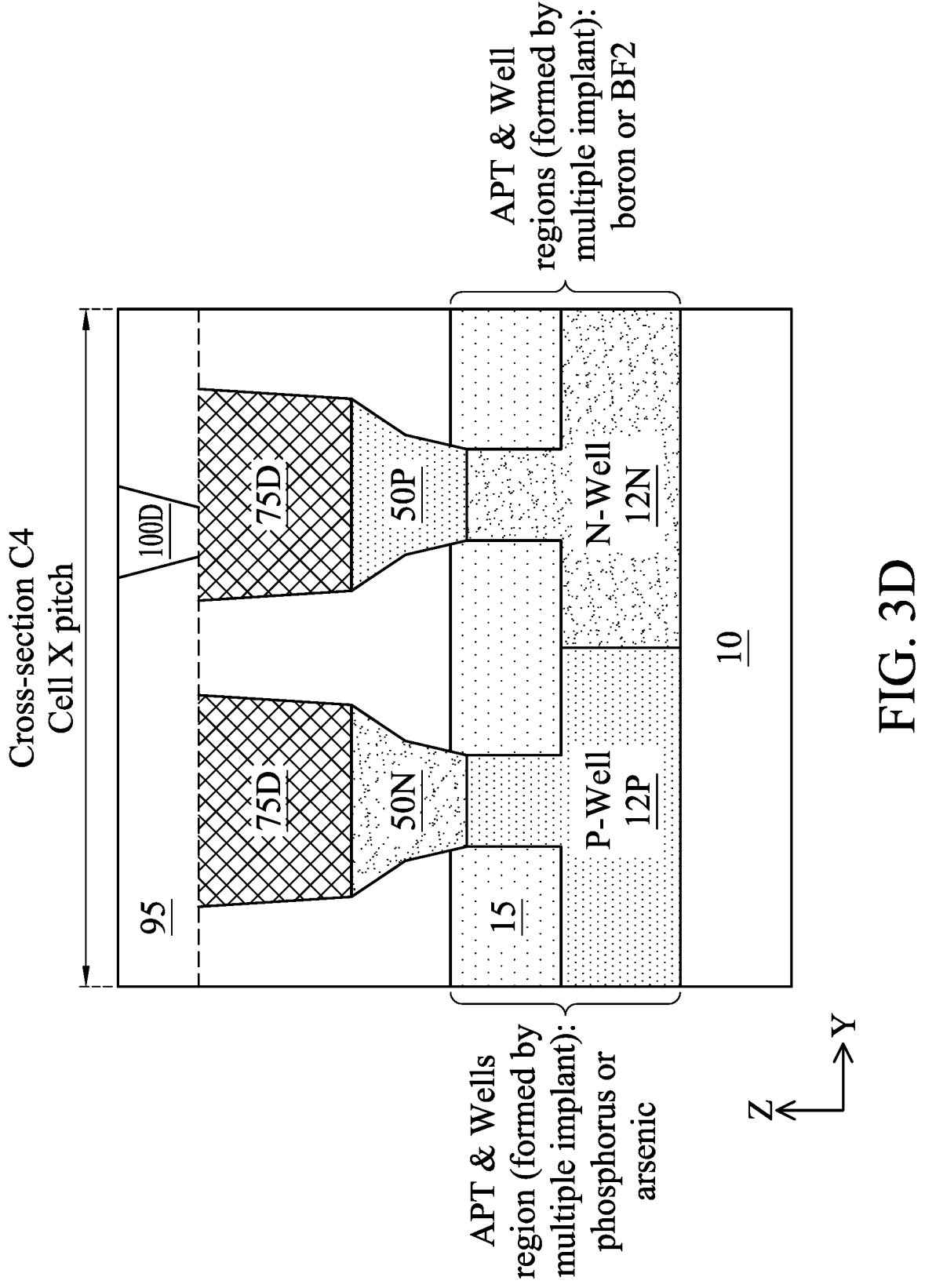

FIGS. 3A, 3B, 3C and 3D show various views of a GAA FET device according to an embodiment of the present disclosure. FIG. 3A is a cross sectional view along the X direction (source-to-drain direction) corresponding to line C1 of FIG. 1, FIG. 3B is a cross sectional view along the X direction corresponding to line C2 of FIG. 1, FIG. 3C is a cross sectional view along the Y direction corresponding to line C3 of FIG. 1 and FIG. 3D shows a cross sectional view along the Y direction corresponding to line C4 of FIG. 1.

The GAA FET device shown in FIGS. 3A-3D is substantially the same as the GAA FET device shown in FIGS. 2A-2D, except that the space S1 is smaller than the space S2 between the bottommost channel region 25 and the planar channel region 11 (without gate dielectric layer) of the N-type GAA FET, and the space S3 is smaller than the space S4 between the bottommost channel region 25 and the planar channel region 11 (without gate dielectric layer) of the P-type GAA FET. In some embodiments, S2/S1 and S4/S3 are in a range from about 1.01 to about 1.5 and in a range from about 1.05 to about 1.3 in other embodiments. When the ratios are greater than these ranges, a parasitic capacitance between the gate electrode and the source/drain would increase, and when the ratios are smaller than these ranges, it would be difficult to form multiple metal layers for the gate electrodes. The larger space S2 can provide a larger manufacturing margin for making a greater channel length G2, G4 for the planar channel and a wider source/drain bottom round shape. The smaller space S1 between the adjacent nanosheets or nanowires can reduce a source/drain depth and decrease a capacitance between the gate electrode and the source/drain epitaxial layer, and also reduce resistance of the source/drain region. In some embodiments, S1 is in a range from about 6 nm to about 16 nm and S2 is in a range from about 7 nm to about 20 nm, depending on the design and/or process requirements. In some embodiments, the upper width of the trapezoidal or tapered gate electrode G4' for both the planar channel 11 and the bottommost one of the nanosheets or nanowires 25 is equal to or greater than the width G3 and smaller than G4. In some embodiments, G4/G4' is in a range from about 1.05 to about 1.3.

In some embodiments, a threshold voltage of the planar channel region 11 (planar FET portion) is greater in an absolute value than a threshold voltage of the nanosheet or nanowire channel regions (GAA FET portion). When an on-voltage is applied to the gate electrode 84N (or 84P), the nanosheet or nanowire channel regions becomes conductive (turns on) so that a current flows between the source and the drain. When an off-voltage is applied to the gate electrode 84N (or 84P), the nanosheet or nanowire channel regions becomes non-conductive (turns off) so that a current does not flow between the source and the drain. Since the planar channel region 11 includes the dopant in the same amount as the well regions, i.e., higher dopant concentration, a leakage current through the planar channel region between the source and the drain can be much more suppressed. In addition, the longer channel length of the planar channel region 11 also suppresses the leakage current.

FIGS. 4 to 17A-17C show various stages of manufacturing a semiconductor FET device according to an embodiment of the present disclosure. It is understood that additional operations can be provided before, during, and after processes shown by FIGS. 4-17C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-3D may be employed in the embodiment of FIGS. 4-17C, and detailed explanation thereof may be omitted.

Figure 4:
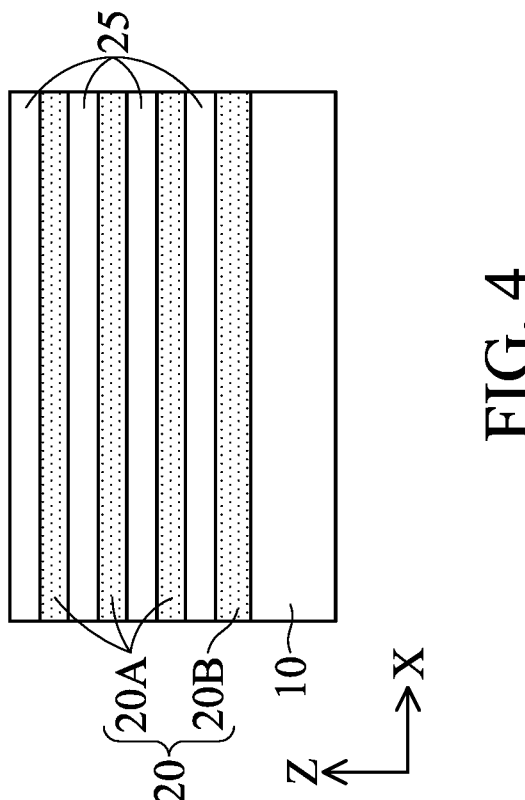
FIG. 4 shows one of the various stages of manufacturing a semiconductor GAA FET device according to an embodiment of the present disclosure.

As shown in FIG. 4, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the substrate 10 is, for example, a p-type silicon substrate with an impurity concentration in a range from about $1\times10^{15}$ atoms·cm$^{-3}$ to about $1\times10^{16}$ atoms·cm$^{-3}$. In other embodiments, the substrate is an n-type silicon or germanium substrate with an impurity concentration in a range from about $1\times10^{15}$ atoms·cm$^{-3}$ to about $1\times10^{16}$ atoms·cm$^{-3}$.

In some embodiments, before the stacked layers are formed, impurity ions (dopants) are implanted into the silicon substrate 10 to form well regions consistent with the well regions 12N, 12P. The ion implantation is performed to prevent a punch-through effect. In some embodiments, the dopant concentration in the well regions is in a range from about $1\times10^{19}$ atoms·cm$^{-3}$ to about $1\times10^{21}$ atoms·cm$^{-3}$.

In some embodiments, the first semiconductor layers 20 and the second semiconductor layers 25 are made of Si, a Si compound, SiGe, Ge or a Ge compound. In one embodiment, the first semiconductor layers 20 are Si$_{1-x}$Ge$_x$, where x is equal to or more than about 0.1 and equal to or less than about 0.6, and the second semiconductor layers 25 are Si or Si$_{1-y}$Ge$_y$, where y is smaller than x and equal to or less than about 0.2. In this disclosure, an "M compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layers 25. Although four first semiconductor layers 20 and four second semiconductor layers 25 are shown in FIG. 4, the numbers are not limited to four, and can be 1, 2, 3 or more than 4, and is less than 20. In some embodiments, the number of the first semiconductor layers 20 is greater by one than the number of the second semiconductor layers 25 (the top and bottom layers are the first semiconductor layer).

In some embodiments, the bottommost first semiconductor layer 20B has a greater thickness than the remaining first semiconductor layers 20A. In some embodiments, the thickness of the bottommost first semiconductor layer 20B (corresponding to the spaces S2, S4) is 1.05 to 1.3 times the thickness of each of the remining first semiconductor layers 20A (corresponding to the spaces S1, S3). In some embodiments, the thickness of the bottommost first semiconductor layer 20B is equal to the thickness of each of the remining first semiconductor layers 20A.

In some embodiments, at least the second semiconductor layers 25, which are subsequently used as channel regions, are non-doped or doped with impurities in a smaller amount than the well regions. In some embodiments, the dopant concentration in the second semiconductor layer 25 is less than about $1\times10^{17}$ atoms·cm$^{-3}$.

Figure 5:
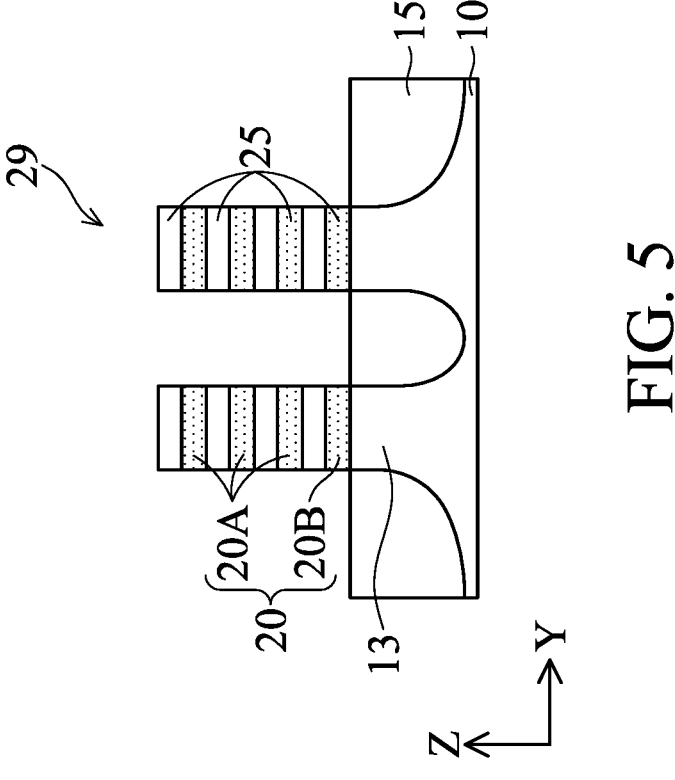
FIG. 5 shows one of the various stages of manufacturing a semiconductor GAA FET device according to an embodiment of the present disclosure.

After the stacked semiconductor layers are formed, fin structures 29 are formed by using one or more lithography and etching operations, as shown in FIG. 5. The fin structures 29 may be patterned by any suitable method. For example, the fin structures may be patterned using one or more photolithography processes such as EUV and DUV lithography, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 5, the fin structures 29 extend in the X direction and are arranged in the Y direction. The number of the fin structures 29 is not limited to two as shown in FIG. 5, and may be as small as one and three or more. In some embodiments, one or more dummy fin structures are formed on both sides of the fin structures 29 to improve pattern fidelity in the patterning operations. As shown in FIG. 5, the fin structures 29 have upper portions constituted by the stacked semiconductor layers 20, 25 and a bottom fin structure 13 (well region).

The width of the upper portion of the fin structure 29 along the Y direction (corresponding to the width W1, W3) is in a range from about 5 nm to about 50 nm in some embodiments, and is in a range from about 10 nm to about 30 nm in other embodiments. In some embodiments, the fin structure 29 has a tapered shape having the top smaller in width than the bottom.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 5, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extreme low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the bottom fin structure 13 is exposed. In other embodiments, the upper portion of the bottom fin structure 13 is not exposed. In some embodiments, the insulating material layer 15 is recessed to a level of the upper surface of the fin structure 13.

The first semiconductor layers 20 are sacrificial layers which are subsequently partially removed, and the second semiconductor layers 25 are subsequently formed into semiconductor wires as channel layers of an n-type GAA FET and/or a p-type GAA FET. In some embodiments, for a p-type GAA FET, the second semiconductor layers 25 are sacrificial layers which are subsequently partially removed, and the first semiconductor layers 20 are subsequently formed into semiconductor wires as channel layers.

Figure 6B:
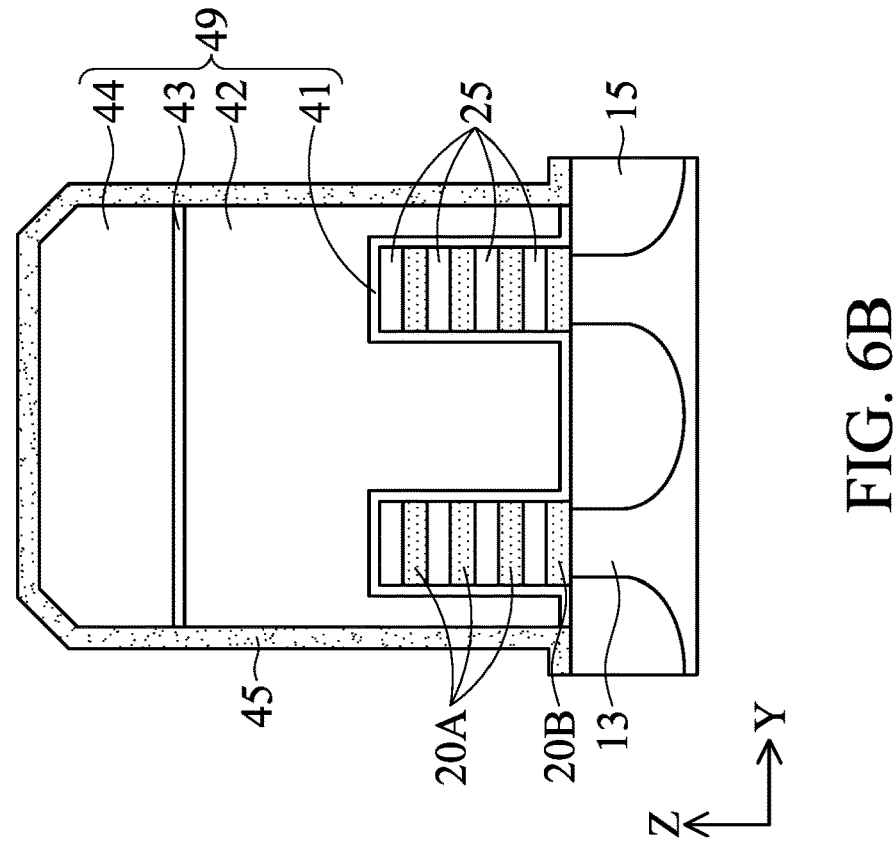
FIGS. 6A and 6B show one of the various stages of manufacturing a semiconductor GAA FET device according to an embodiment of the present disclosure.
Figure 6A:
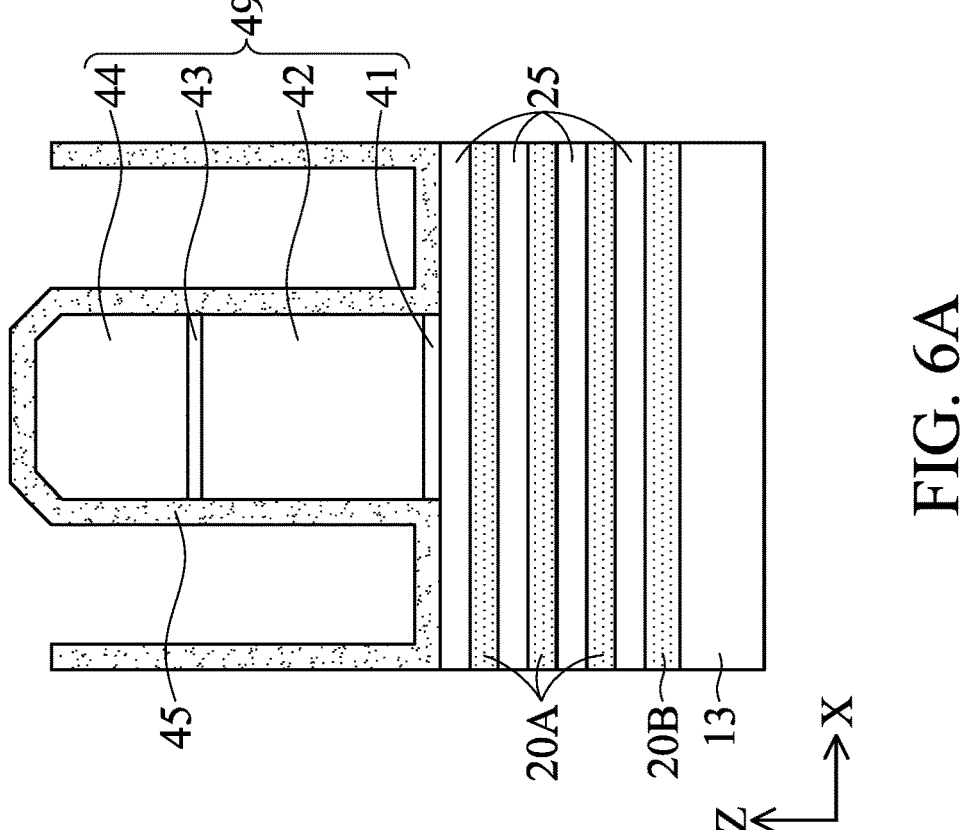

After the isolation insulating layer 15 is formed, a sacrificial (dummy) gate structure 49 is formed, as shown in FIGS. 6A and 6B. FIGS. 6A and 6B illustrate a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed and the mask layer and sacrificial gate electrode layer are patterned into the sacrificial gate structure 49, as shown in FIGS. 6A and 6B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIGS. 6A and 6B. In this disclosure, a source and a drain are interchangeably used and the structures thereof are substantially the same. In FIGS. 6A and 6B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for gate sidewall spacers is formed over the sacrificial gate structure 49, as shown in FIGS. 6A and 6B. The first cover layer 45 is deposited in a conformal manner so that it is has substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, SiON, SiCN, SiCO, SiOCN or any other suitable dielectric material. The first cover layer 45 can be formed by ALD or CVD, or any other suitable method.

Figures 7, 8:
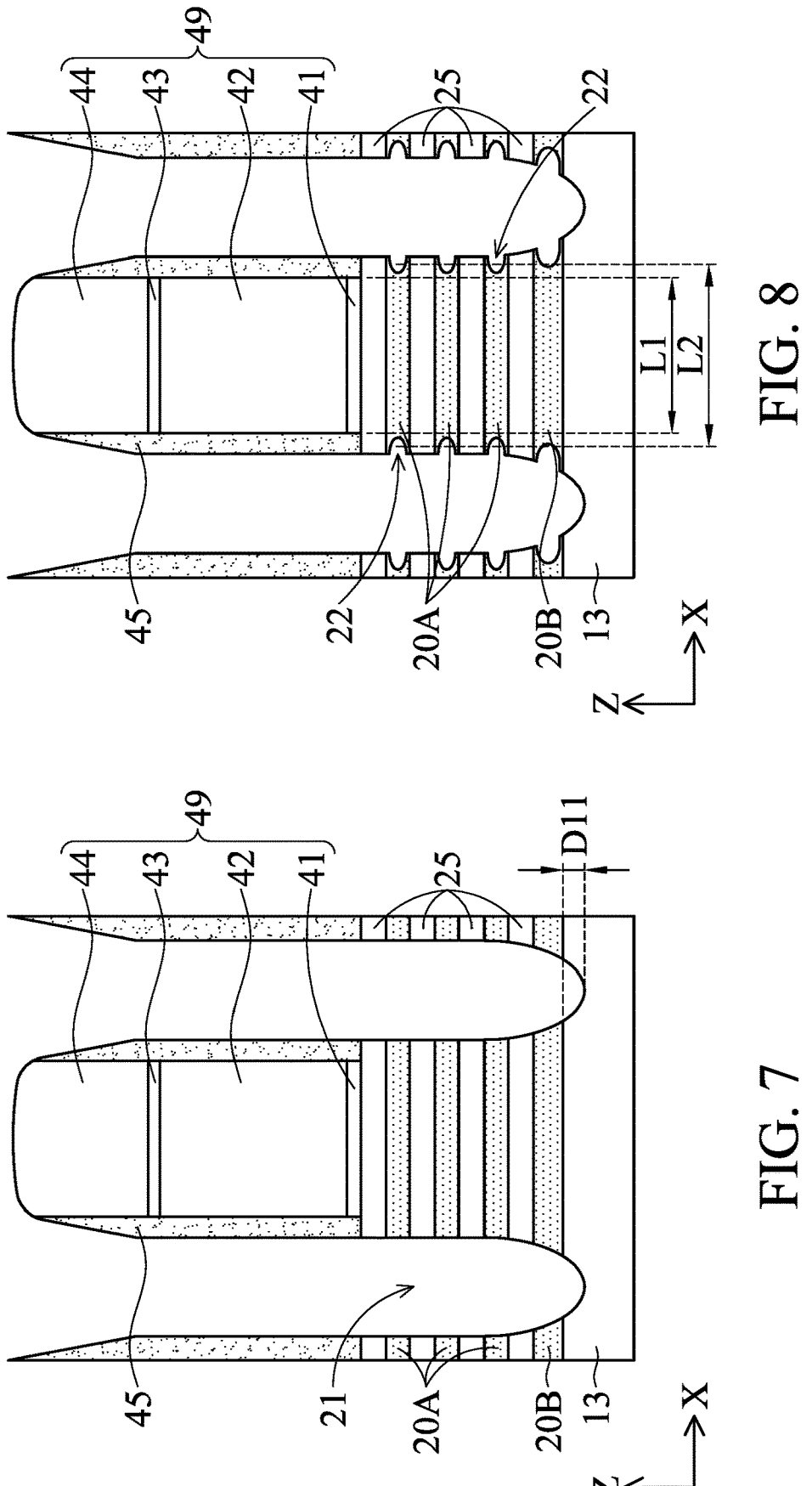
FIG. 7 shows one of the various stages of manufacturing a semiconductor GAA FET device according to an embodiment of the present disclosure.
FIG. 8 shows one of the various stages of manufacturing a semiconductor GAA FET device according to an embodiment of the present disclosure.

Next, as shown in FIG. 7, the first cover layer 45 is anisotropically etched to remove the first cover layer 45 disposed on the source/drain region, while leaving the first cover layer 45 as the gate sidewall spacers on side faces of the sacrificial gate structure 49. Then, the stacked structure of the first semiconductor layers 20 and the second semiconductor layer 25 is etched down at the source/drain region, by using one or more lithography and etching operations, thereby forming a source/drain space 21. In some embodiments, a part of the bottom fin structure 13 is also partially etched to a depth D11 of about 5 nm to about 35 nm. In some embodiments, an n-type FET and a p-type FET are manufactured separately, and in such a case, a region for one type of FETs is processed, a region for the other type of FETs is covered by a protective layer, such as a silicon nitride.

In some embodiments, as shown in FIG. 7, the source/drain space 21 has a tapered shape having a width gradually decreasing from the top to the bottom (e.g., a U-shape, a rounded tapered shape, or a V-shape), due to a high aspect ratio of the sacrificial gate structures 49 (a height of the sacrificial gate structure to a space between adjacent sacrificial gate structures). In some embodiments a width of the source/drain space 21 along the X direction measured at the bottommost first semiconductor layer 20B is about 1-10 nm smaller than that at the remaining first semiconductor layers 20A. In some embodiments, the width of the source/drain space 21 measured at the first semiconductor layers 20A is substantially constant.

Further, as shown in FIG. 8, the first semiconductor layers 20 are laterally etched in the X direction within the source/drain space 21, thereby forming cavities 22.

When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time using the mixed solution is in a range from about 1 min to about 2 min in some embodiments. The mixed solution is used at a temperature in a range from about 60° C. to about 90° C. in some embodiments. Other etchants may be used. By using the mixed solution, the ends of the first semiconductor layer 20 have a curved shape. When the first semiconductor layer 20 is made of SiGe having a constant Ge concentration, the wet etching causes more etching at the center portion than the edge portions in the vertical direction due to surface tension and capillary action, and thus the end of the first semiconductor layer has a smiling shape having a deeply etched center region in some embodiments.

In some embodiments, after the lateral etching, the first semiconductor layers 20A under the sacrificial gate structure 49 have substantially the same length L1 (for example, within ± about 0.5 nm), while the bottommost first semiconductor layer 20B has a length L2 greater than the length L1. The length L1 corresponds to the channel lengths G1, G3 and the length L2 corresponds to the channel lengths G2, G4. In some embodiments, the difference in length of the remaining first semiconductor layers 20 is not zero. In some embodiments, after the lateral etching, the first semiconductor layers 20A under the sacrificial gate structure 49 have different lengths which vary by about 0.1 nm to about 0.5 nm.

Figures 9, 10:
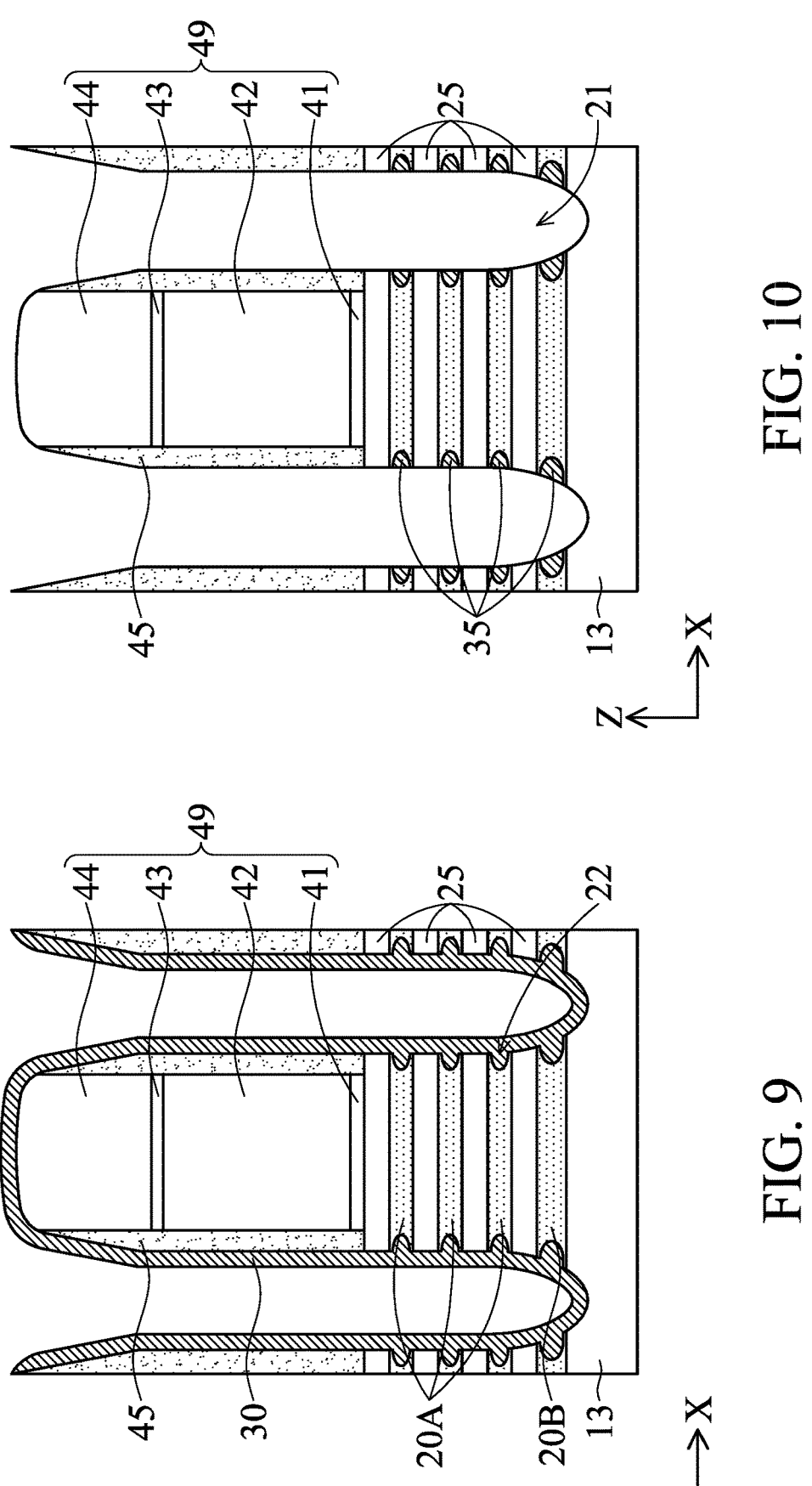
FIG. 9 shows one of the various stages of manufacturing a semiconductor GAA FET device according to an embodiment of the present disclosure.
FIG. 10 shows one of the various stages of manufacturing a semiconductor GAA FET device according to an embodiment of the present disclosure.

Next, as shown in FIG. 9, a first insulating layer 30 is conformally formed on the etched lateral ends of the first semiconductor layers 20 and on end faces of the second semiconductor layers 25 in the source/drain space 21 and over the sacrificial gate structure 49. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 are fully filled with the first insulating layer 30. In some embodiments, the insulating layer 30 includes two or three layers made of different materials from each other. In some embodiments, one of the insulating layers is formed by oxidation of the ends of the first semiconductor layers 20 and the oxide layer is made of silicon-germanium oxide (Si-GeO$_x$). In some embodiments, the thickness of the silicon-germanium oxide is in a range from about 0.1 nm to about 1 nm.

After the first insulating layer 30 is formed, an etching operation is performed to partially remove the first insulating layer 30, thereby forming inner spacers 35, as shown in FIG. 10. In some embodiments, the end face of the inner spacers 35 is recessed more than the end face of the second semiconductor layers 25. The recessed amount is in a range from about 0.1 nm to about 2 nm and is in a range from about 0.2 nm to about 1 nm in other embodiments. In other embodiments, the recessed amount is less than 0.5 nm and may be equal to zero (the end face of the inner spacer 35 and the end face of the second semiconductor layers 25 are flush with each other).

In some embodiments, before forming the first insulating layer 30, an additional insulating layer having a smaller thickness than the first insulating layer 30 is formed, and thus the inner spacers 35 have a two-layer structure.

Figure 11:
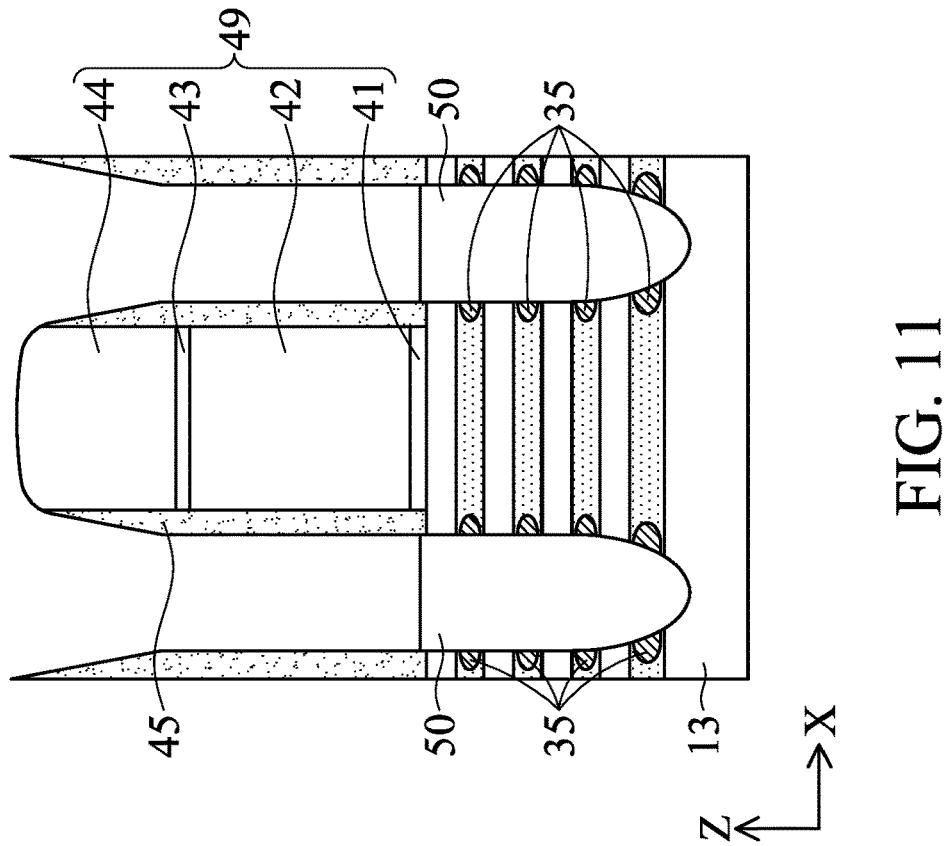
FIG. 11 shows one of the various stages of manufacturing a semiconductor GAA FET device according to an embodiment of the present disclosure.

Subsequently, as shown in FIG. 11, a source/drain epitaxial layer 50 consistent with epitaxial layer 50N, 50P is formed in the source/drain space 21. The source/drain epitaxial layer for an n-type FET is formed separately from the source/drain epitaxial layer for a p-type FET. The source/drain epitaxial layer 50 is formed by an epitaxial growth method using CVD, ALD or molecular beam epitaxy (MBE). As shown in FIG. 11, the source/drain epitaxial layer 50 is selectively formed on semiconductor regions. The source/drain epitaxial layer 50 is formed in contact with end faces of the second semiconductor layers 25, and formed in contact with the inner spacers 35.

Figure 12:
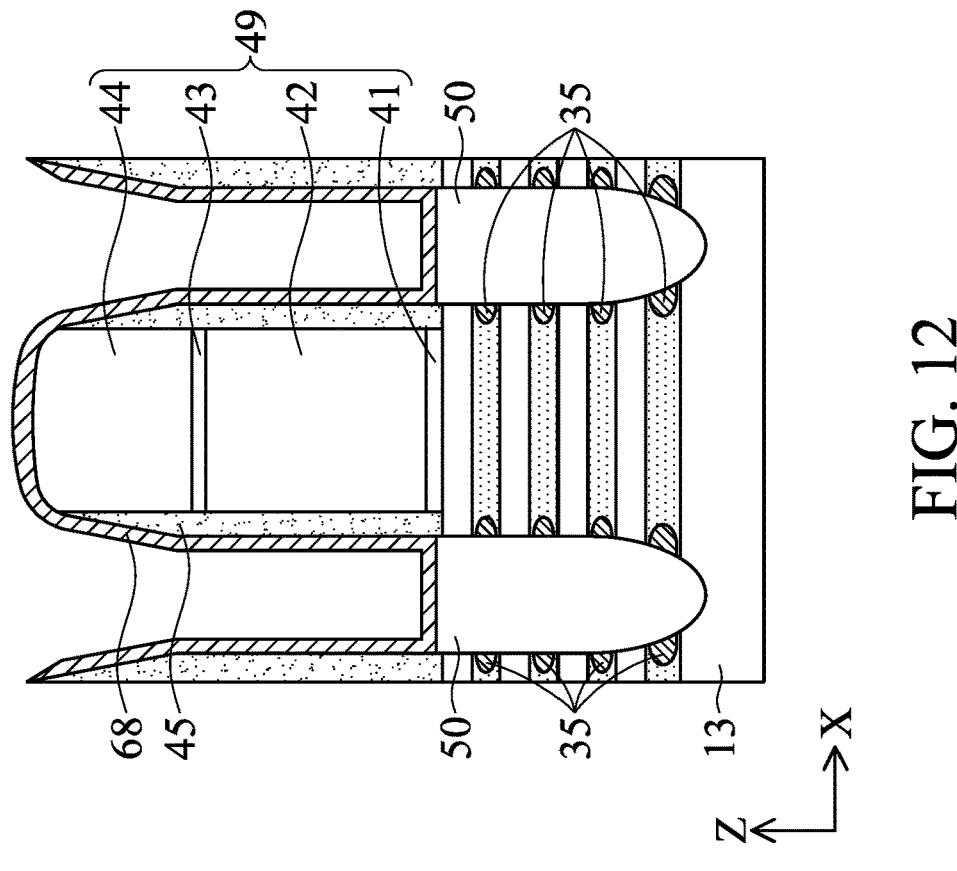
FIG. 12 shows one of the various stages of manufacturing a semiconductor GAA FET device according to an embodiment of the present disclosure.

Then, as shown in FIG. 12, an etch stop layer 68 is formed. The etch stop layer 68 includes one of silicon nitride and silicon oxide, SiON, SiOC, SiCN and SiOCN, or any other suitable dielectric material. The etch stop layer 68 is made of a different material than the sidewall spacers (first cover layer) 45. The etch stop layer 68 can be formed by ALD or any other suitable methods.

Figure 14:
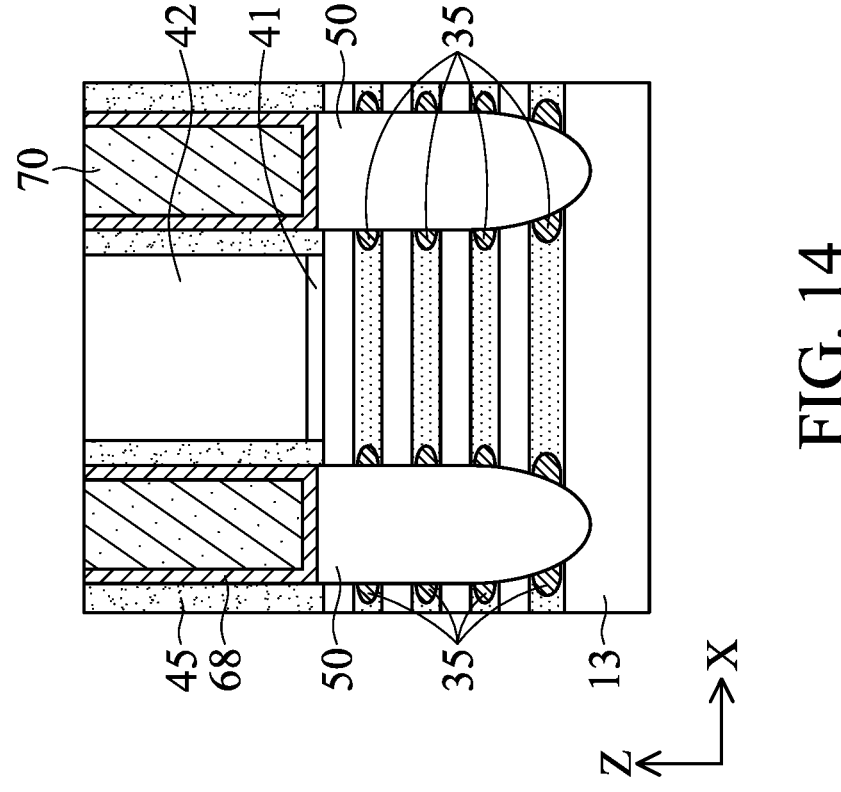
FIG. 14 shows one of the various stages of manufacturing a semiconductor GAA FET device according to an embodiment of the present disclosure.
Figure 13:
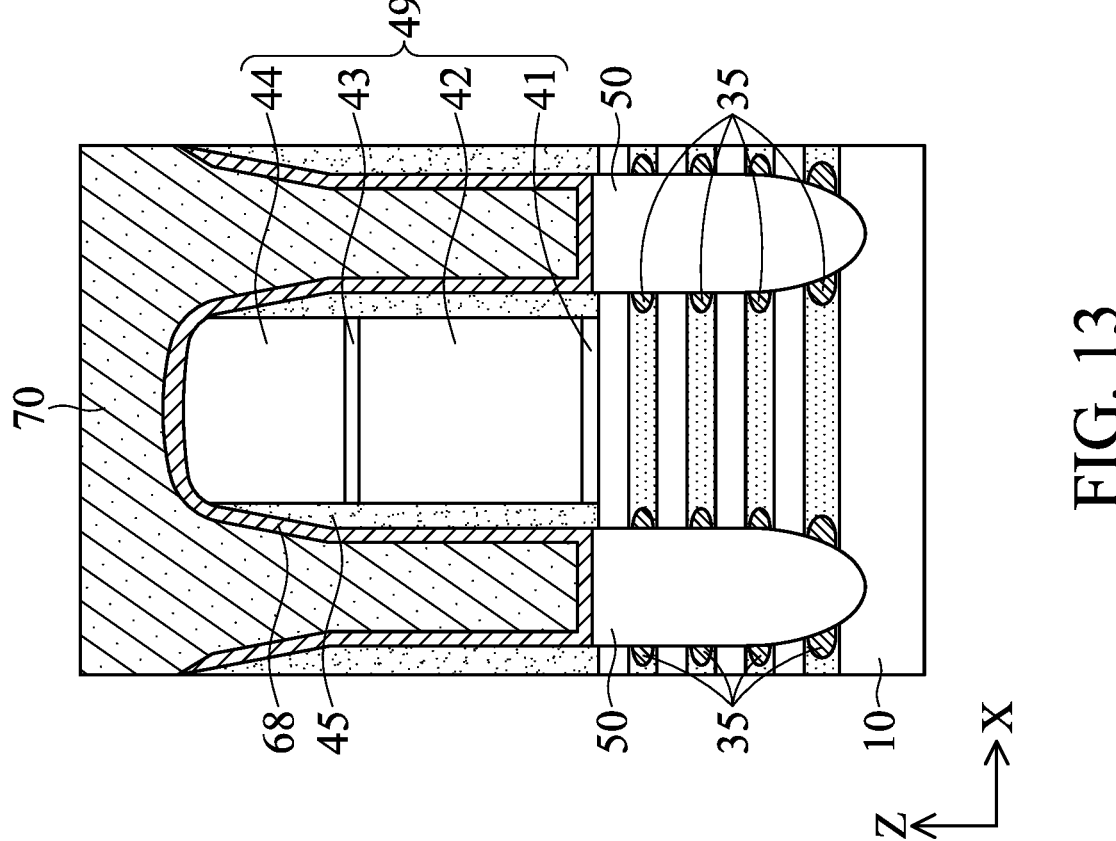
FIG. 13 shows one of the various stages of manufacturing a semiconductor GAA FET device according to an embodiment of the present disclosure.

Next, as shown in FIG. 13, a first interlayer dielectric (ILD) layer 70 is formed over the etch stop layer 68. The materials for the ILD layer 70 include compounds comprising Si, O. C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed, as shown in FIG. 14.

Then, the sacrificial gate electrode layer 42 and sacrificial gate dielectric layer 41 are removed. The ILD layer 70 protects the source/drain epitaxial layers 50 and 55 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Figure 15:
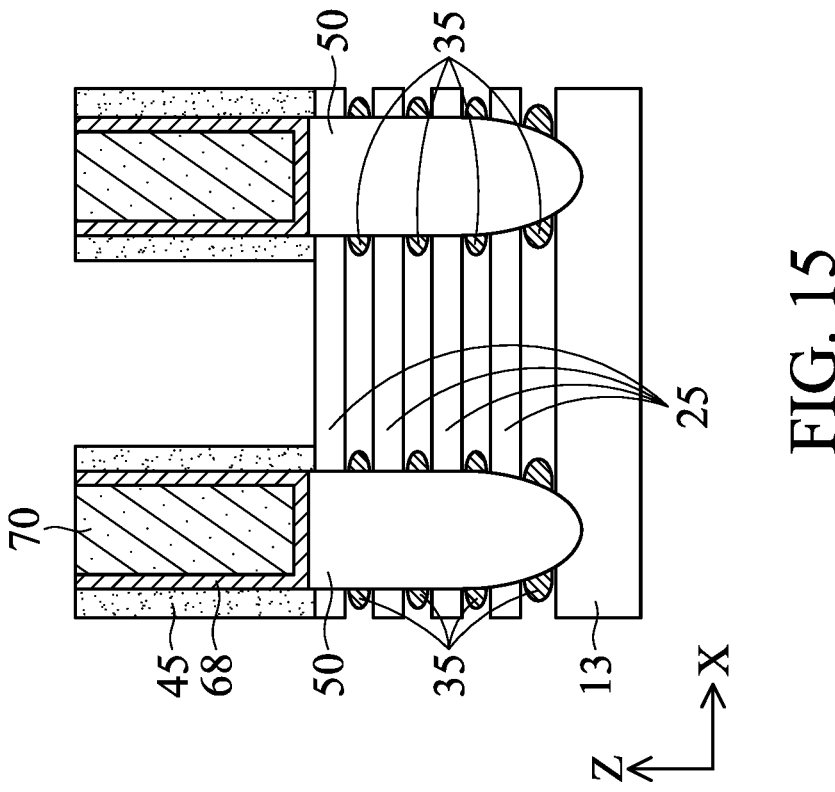
FIG. 15 shows one of the various stages of manufacturing a semiconductor GAA FET device according to an embodiment of the present disclosure.

After the sacrificial gate structures are removed, the first semiconductor layers 20 are removed, thereby forming nanosheets or nanowires (channel regions) of the second semiconductor layers 25, as shown in FIG. 15. The first semiconductor layers 20 can be removed or etched using an etchant that can selectively etch the first semiconductor layers 20 against the second semiconductor layers 25, as set forth above. As shown in FIG. 15, since the first insulating layers (inner spacers) 35 are formed, the etching of the first semiconductor layers 20 stops at the first insulating layer 35. In other words, the first insulating layer 35 functions as an etch-stop layer for etching of the first semiconductor layers 20.

Figure 16:
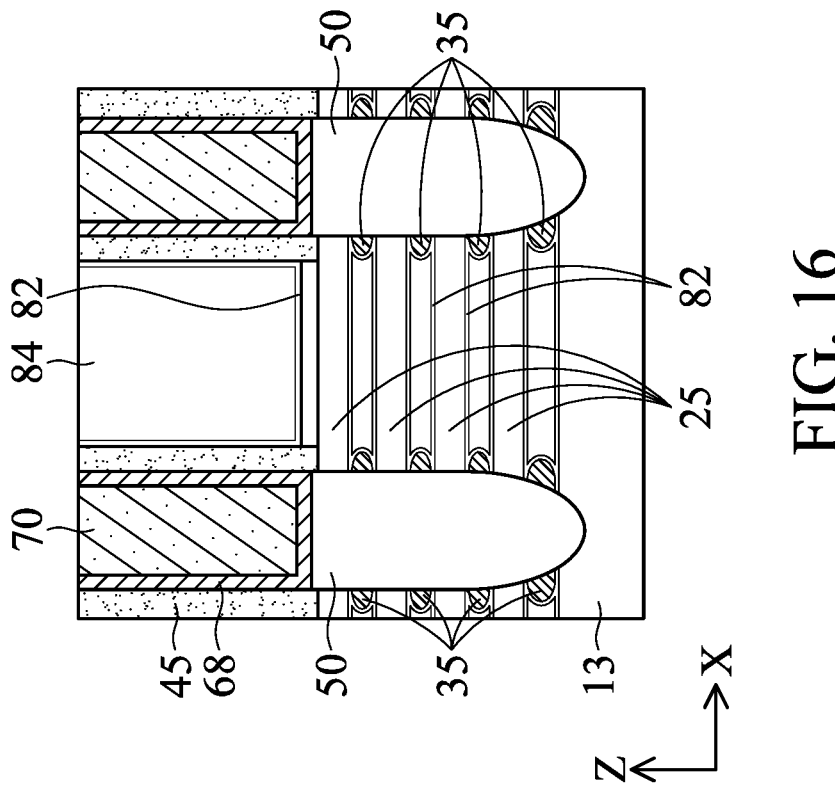
FIG. 16 shows one of the various stages of manufacturing a semiconductor GAA FET device according to an embodiment of the present disclosure.

After the semiconductor nanosheets or nanowires (channel regions) of the second semiconductor layers 25 are formed, a gate dielectric layer 82 is formed around each channel regions. Further, a gate electrode layer 84 is formed on the gate dielectric layer 82, as shown in FIG. 16. In some embodiments, the structure and/or material of the gate electrode for the n-type GAA FET are different from the structure and/or material of the gate electrode for the p-type GAA FET.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in some embodiments.

The gate electrode layer 84 is formed on the gate dielectric layer 82 to surround each channel layer. The gate electrode layer 84 may be formed by CVD, ALD, electroplating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed.

In some embodiments, before the gate electrode layer 84 is formed, the gate sidewall spacers 45 are recessed. In some embodiments, the gate sidewall spacers 45 are recessed before the gate dielectric layer 82 is formed.

Figure 17B:
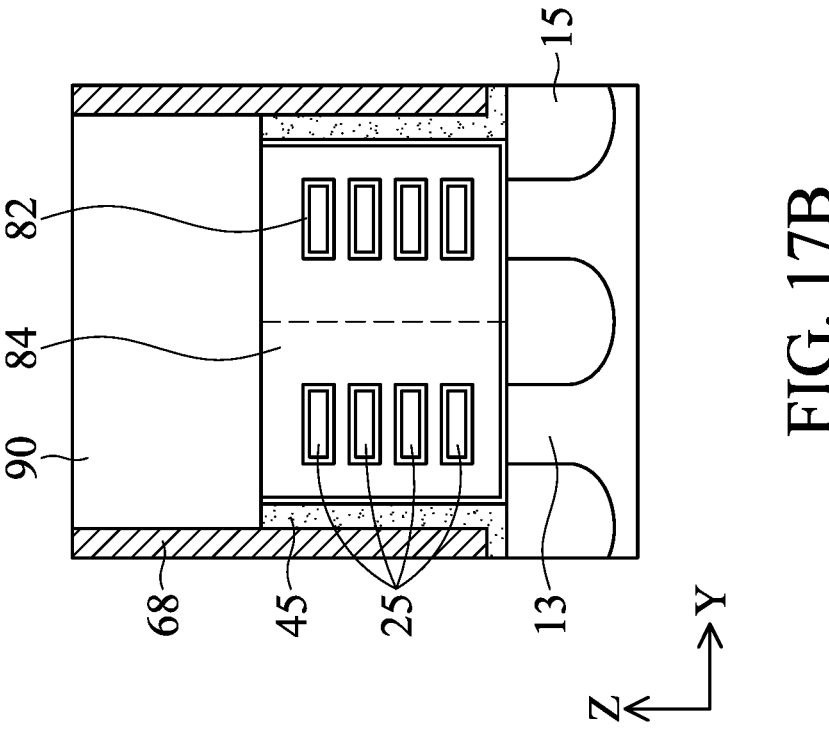
FIGS. 17A, 17B and 17C show one of the various stages of manufacturing a semiconductor GAA FET device according to an embodiment of the present disclosure.
Figure 17A:
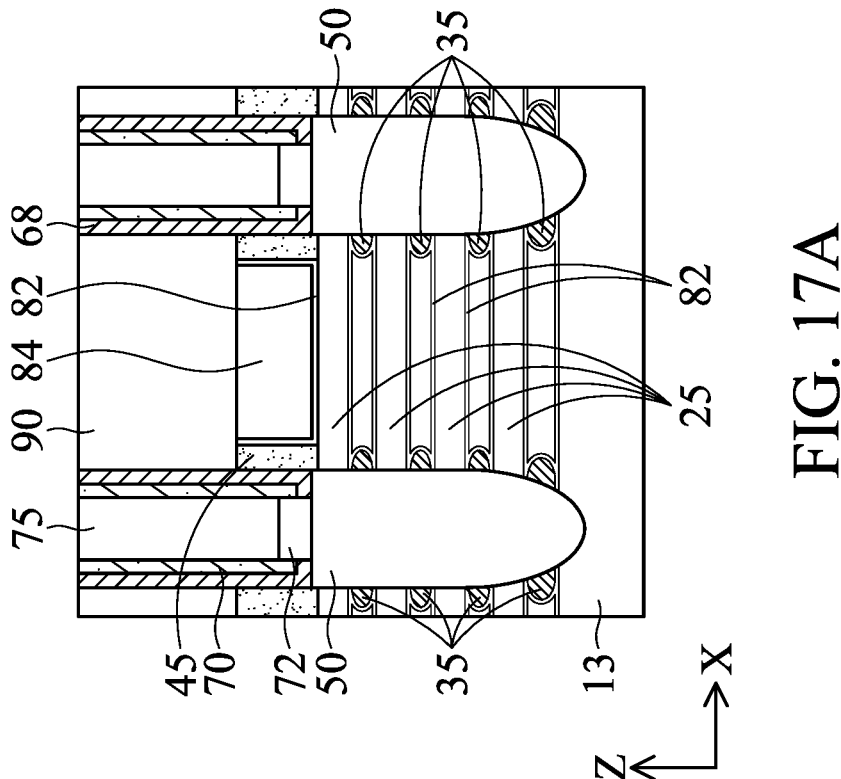
Figure 17C:
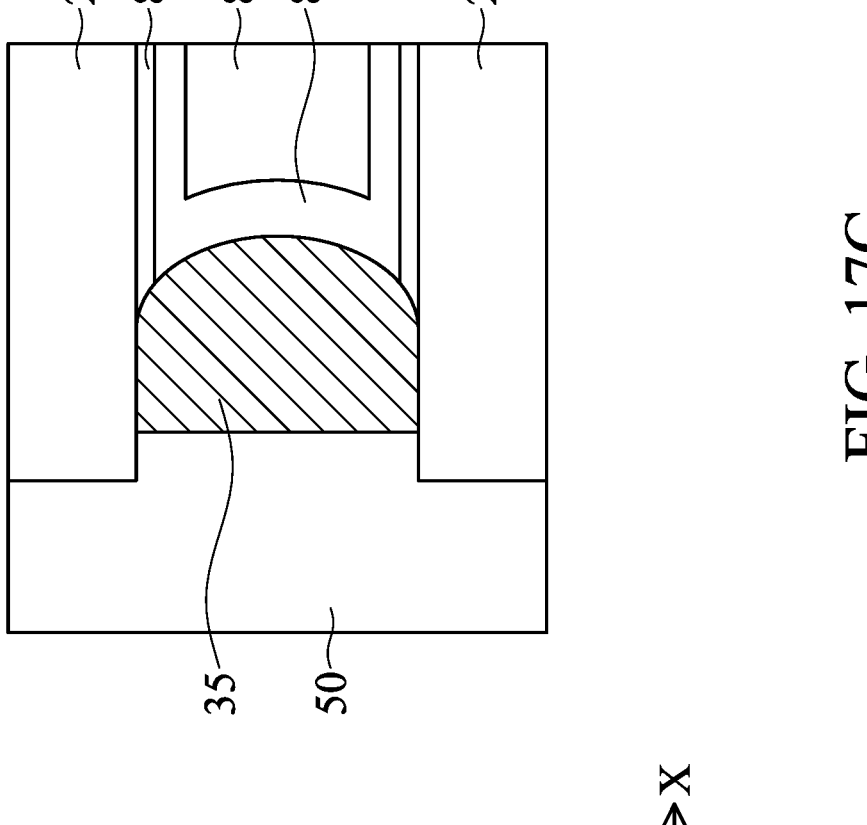

In some embodiments, after the planarization operation, the gate electrode layer 84 is recessed and a cap insulating layer 90 is formed over the recessed gate electrode 84, as shown in FIGS. 17A and 17B. FIG. 17C shows an enlarged view around the inner spacer 35. The cap insulating layer 90 includes one or more layers of a silicon nitride-based material, such as silicon nitride. The cap insulating layer 90 is formed by depositing an insulating material followed by a planarization operation.

Subsequently, contact holes are formed in the ILD layer 70 and the etch stop layer 68 by using dry etching, thereby exposing the upper portion of the source/drain epitaxial layer 50. In some embodiments, a silicide layer 72 is formed over the source/drain epitaxial layer 50. The silicide layer 72 includes one or more of WSi, CoSi, NiSi, TiSi, MoSi and TaSi. Then, a conductive contact layer 75 consistent with source and drain contacts 75S, 75D is formed in the contact holes as shown in FIG. 17A. The conductive contact layer 75 includes one or more of Co. Ni, W. Ti. Ta, Cu, Al, TiN and TaN. Further, one or more ILD layers 95 (see, FIGS. 2A-3D) are formed.

It is understood that the GAA FETs undergo further CMOS processes to form various features such as contacts/vias, interconnect metal layers, dielectric layers, passivation layers, etc.

In the GAA FET device of the present disclosure, it is possible to reduce an off-current, a capacitance between the gate electrode and the source/drain epitaxial layer and the resistance of the source/drain region, which in turn improves device performance.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure in which first semiconductor layers and second semiconductor layers are alternately stacked over a bottom fin structure protruding from a substrate, is formed, a sacrificial gate structure is formed over the fin structure, a source/drain region of the fin structure, which is not covered by the sacrificial gate structure, is etched, thereby forming a source/drain space, the first semiconductor layers are laterally etched through the source/drain space, an inner spacer made of a dielectric material is formed on an end of each of the etched first semiconductor layers, one or more epitaxial layers are formed in the source/drain space, and the sacrificial gate structure is replaced with a metal gate structure. A width of the source/drain space at a bottommost one of the first semiconductor layers is smaller than a width of the source/drain space at one of the first semiconductor layers above the bottommost one of the first semiconductor layers. In one or more of the foregoing and following embodiments, a bottom of the source/drain space has a tapered shape of which width decreases toward the substrate. In one or more of the foregoing and following embodiments, when the sacrificial gate structure is replaced with the metal gate structure, a sacrificial gate electrode and a sacrificial gate dielectric layer included in the sacrificial gate structure are removed, thereby forming a gate space, parts of the first semiconductor layers in the gate space are removed, thereby leaving channel regions constituted by the second semiconductor layers, a gate dielectric layer is formed to wrap around each of the second semiconductor layers in the gate space, and a gate electrode is formed over the gate dielectric layer. A channel length G2 of a bottommost one of the second semiconductor layers is greater than a channel length G1 of each of the second semiconductor layers other than the bottommost one of the second semiconductor layers. In one or more of the foregoing and following embodiments, G2/G1 is in a range from 1.05 to 1.4. In one or more of the foregoing and following embodiments, a part of the gate electrode disposed between the bottommost one of the second semiconductor layers and a top of the bottom fin structure has a tapered shape in a cross section. In one or more of the foregoing and following embodiments, a bottom width of the tapered shape is 1.05 to 1.4 times a top width of the tapered shape. In one or more of the foregoing and following embodiments, a planar channel region is formed at the bottom fin structure. In one or more of the foregoing and following embodiments, the source/drain space penetrates the bottom fin structure by an amount of 5 nm to 35 nm. In one or more of the foregoing and following embodiments, a thickness of a bottommost one of the first semiconductor layers is greater than a thickness of the first semiconductor layers other than the bottommost one of the first semiconductor layers.

In accordance with another aspect of the present disclosure, in a method of manufacturing a semiconductor device, a fin structure, in which first semiconductor layers and second semiconductor layers are alternately stacked over a bottom fin structure protruding from a substrate, is formed, a sacrificial gate structure is formed over the fin structure, a source/drain region of the fin structure, which is not covered by the sacrificial gate structure is etched, thereby forming a source/drain space, the first semiconductor layers are laterally etched through the source/drain space, an inner spacer made of a dielectric material is formed on an end of each of the etched first semiconductor layers, one or more epitaxial layers are formed in the source/drain space, and the sacrificial gate structure is replaced with a metal gate structure. A thickness of a bottommost one of the first semiconductor layers is greater than a thickness of the first semiconductor layers other than the bottommost one of the first semiconductor layers. In one or more of the foregoing and following embodiments, when the replacing the sacrificial gate structure is replaced with the metal gate structure, a sacrificial gate electrode and a sacrificial gate dielectric layer included in the sacrificial gate structure are removed, thereby forming a gate space, parts of the first semiconductor layers are removed in the gate space, thereby leaving channel regions constituted by the second semiconductor layers, a gate dielectric layer is formed to wrap around each of the second semiconductor layers in the gate space, and a gate electrode is formed over the gate dielectric layer. A channel length G2 of a bottommost one of the second semiconductor layers is greater than a channel length G1 of each of the second semiconductor layers other than the bottommost one of the second semiconductor layers. In one or more of the foregoing and following embodiments, G2/G1 is in a range from 1.05 to 1.4. In one or more of the foregoing and following embodiments, a part of the gate electrode disposed between the bottommost one of the second semiconductor layers and a top of the bottom fin structure has a tapered shape in a cross section. In one or more of the foregoing and following embodiments, a bottom width of the tapered shape is 1.05 to 1.4 times a top width of the tapered shape. In one or more of the foregoing and following embodiments, a planar channel region is formed at the bottom fin structure. In one or more of the foregoing and following embodiments, the source/drain space penetrates the bottom fin structure by an amount of 5 nm to 35 nm.

In accordance with another aspect of the present disclosure, in a method of manufacturing a semiconductor device, a fin structure in which first semiconductor layers and second semiconductor layers are alternately stacked over a bottom fin structure protruding from a substrate, a sacrificial gate structure is formed over the fin structure, where the sacrificial gate structure including a sacrificial gate electrode and a sacrificial gate dielectric layer, a gate sidewall spacer is formed, a source/drain region of the fin structure, which is not covered by the sacrificial gate structure, is etched, thereby forming a source/drain space, the first semiconductor layers are laterally etched through the source/drain space, an inner spacer made of a dielectric material is formed on an end of each of the etched first semiconductor layers, one or more epitaxial layers are formed in the source/drain space, an interlayer dielectric layer is formed, the sacrificial gate electrode and the sacrificial gate dielectric layer are removed, thereby forming a gate space, the gate sidewall spacer is recessed, parts of the first semiconductor layers are removed in the gate space, thereby leaving channel regions constituted by the second semiconductor layers, a gate dielectric layer is formed to wrap around each of the second semiconductor layers in the gate space, and a gate electrode is formed over the gate dielectric layer. A planar channel region is formed at the bottom fin structure, and a channel length of the planar channel region is greater than a channel length of each of the channel regions constituted by the second semiconductor layers. In one or more of the foregoing and following embodiments, a vertical length of the recessed gate sidewall spacer is greater than a vertical length of the inner spacer. In one or more of the foregoing and following embodiments, a thickness S2 of a bottommost one of the first semiconductor layers is greater than a thickness S1 of the first semiconductor layers other than the bottommost one of the first semiconductor layers. In one or more of the foregoing and following embodiments, S2/S1 is in a range from 1.05 to 1.3.

In accordance with another aspect of the present disclosure, a semiconductor device includes semiconductor sheets or wires disposed over a bottom fin structure protruding from a substrate, a source/drain epitaxial layer in contact with the semiconductor wires or sheets, a gate dielectric layer disposed on and wrapping around each channel region of the semiconductor wires or sheets, and a gate electrode layer disposed on the gate dielectric layer and wrapping around each channel region. A planar channel region is formed at the bottom fin structure, and a channel length G2 of the planar channel region is greater than a channel length G1 of each channel region of the semiconductor wires or sheets. In one or more of the foregoing and following embodiments, G2/G1 is in a range from 1.05 to 1.4. In one or more of the foregoing and following embodiments, the channel length G2 is in a range from 5 nm to 20 nm and the channel length G1 is in a range from 6 nm to 24 nm. In one or more of the foregoing and following embodiments, the planar channel region has a dopant concentration higher than a dopant concentration of the channel region of the semiconductor wires or sheets. In one or more of the foregoing and following embodiments, the channel region of the semiconductor sheets or wires is non-doped. In one or more of the foregoing and following embodiments, a part of the gate electrode layer disposed between a bottommost one of the semiconductor sheets or wires and a top of the bottom fin structure has a tapered shape in a cross section. In one or more of the foregoing and following embodiments, a bottom width of the tapered shape is 1.05 to 1.4 times a top width of the tapered shape. In one or more of the foregoing and following embodiments, a distance S2 between a bottom surface of a bottommost one of the semiconductor sheets or wires and a top surface of the bottom fin structure is greater than a distance S1 between adjacent semiconductor wires or sheets.

In accordance with another aspect of the present disclosure, a semiconductor device includes semiconductor sheets or wires disposed over a bottom fin structure protruding from a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each channel region, and insulating spacers disposed in spaces, respectively, the spaces being defined by adjacent semiconductor wires or sheets, the gate electrode layer and the source/drain region. A distance S2 between a bottom surface of a bottommost one of the semiconductor sheets or wires and a top surface of the bottom fin structure is greater than a distance S1 between adjacent semiconductor wires or sheets. In one or more of the foregoing and following embodiments, S2/S1 is in a range from 1.05 to 1.3. In one or more of the foregoing and following embodiments, the distance S2 is in a range from 7 nm to 20 nm and the distance S1 is in a range from 6 nm to 16 nm. In one or more of the foregoing and following embodiments, a planar channel region is formed at the bottom fin structure, and a channel length of the planar channel region is greater than a channel length of each channel region of the semiconductor wires or sheets. In one or more of the foregoing and following embodiments, the channel length of each channel region of the semiconductor sheets or wires is not uniform. In one or more of the foregoing and following embodiments, a gate sidewall spacer is formed on a sidewall of the gate electrode layer, and a vertical length of the recessed gate sidewall spacer is greater than a vertical length of the inner spacer. In one or more of the foregoing and following embodiments, the semiconductor device further includes a gate cap insulating layer disposed over the gate electrode layer and the gate sidewall spacer.

In accordance with another aspect of the present disclosure, a semiconductor device includes semiconductor sheets or wires disposed over a bottom fin structure protruding from a substrate, a source/drain epitaxial layer in contact with the semiconductor wires or sheets, a gate dielectric layer disposed on and wrapping around each channel region of the semiconductor wires or sheets, and a gate electrode layer disposed on the gate dielectric layer and wrapping around each channel region. A planar channel region is formed at the bottom fin structure, and a threshold voltage of the planar channel region is greater in absolute value than a threshold voltage of the channel region of the semiconductor wires or sheets. In one or more of the foregoing and following embodiments, a bottom of the source/drain epitaxial layer penetrates the bottom fin structure by an amount of 5 nm to 35 nm. In one or more of the foregoing and following embodiments, a distance S2 between a bottom surface of a bottommost one of the semiconductor sheets or wires and a top surface of the bottom fin structure is greater than a distance S1 between adjacent semiconductor wires or sheets. In one or more of the foregoing and following embodiments, a channel length of the planar channel region is greater than a channel length of each channel region of the semiconductor wires or sheets. In one or more of the foregoing and following embodiments, the planar channel region has a dopant concentration higher than a dopant concentration of the channel region of the semiconductor wires or sheets.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a fin structure in which first semiconductor layers and second semiconductor layers are alternately stacked over a bottom fin structure protruding from a substrate, the fin structure extending lengthwise along a first direction;

forming a sacrificial gate structure over the fin structure, the sacrificial gate structure extending lengthwise along a second direction perpendicular to the first direction;

forming gate sidewall spacers along sidewall of the sacrificial gate structure;

etching a source/drain region of the fin structure, which is not covered by the sacrificial gate structure, thereby forming a source/drain space;

laterally etching the first semiconductor layers through the source/drain space;

forming an inner spacer made of a dielectric material on an end of each of the etched first semiconductor layers;

forming one or more epitaxial layers in the source/drain space;

removing a sacrificial gate electrode and a sacrificial gate dielectric layer included in the sacrificial gate structure, thereby forming a gate space;

removing parts of the first semiconductor layers in the gate space, thereby leaving channel regions constituted by the second semiconductor layers;

forming a gate dielectric layer to wrap around each of the second semiconductor layers in the gate space and to interface a top surface of the bottom fin structure;

forming a gate electrode over the gate dielectric layer;

after the forming of the gate electrode, forming a gate end dielectric layer to interface the gate electrode along the second direction;

recessing the gate dielectric layer, the gate electrode and the gate sidewall spacers to form a gate recess; and depositing a cap dielectric layer over the gate recess,

wherein a width of the source/drain space at a bottommost one of the first semiconductor layers is smaller than a width of the source/drain space at one of the first semiconductor layers above the bottommost one of the first semiconductor layers, wherein the forming of the gate electrode forms a bottom channel length G2 with respect to the bottom fin structure and an upper channel length G1 with respect to the second semiconductor layers, wherein the bottom channel length G2 is greater than the upper channel length G1.

2. The method of claim 1, further comprising:

after the forming of the one or more epitaxial layers in the source/drain space, depositing an etch stop layer over the one or more epitaxial layers, wherein, after the recessing, a top surface of the etch stop layer is higher than top surfaces of the gate sidewall spacers, wherein a bottom of the source/drain space has a tapered shape of which width decreases toward the substrate.

3. The method of claim 1, wherein G2/G1 is in a range from 1.05 to 1.4.

4. The method of claim 1, wherein a part of the gate electrode disposed between a bottommost one of the second semiconductor layers and the top surface of the bottom fin structure has a tapered shape in a cross section.

5. The method of claim 4, wherein a bottom width of the tapered shape is 1.05 to 1.4 times a top width of the tapered shape.

6. The method of claim 1, wherein a planar channel region is formed at the bottom fin structure.

7. The method of claim 1, wherein the source/drain space penetrates the bottom fin structure by an amount of 5 nm to 35 nm.

8. The method of claim 1, wherein a thickness of a bottommost one of the first semiconductor layers is greater than a thickness of the first semiconductor layers other than the bottommost one of the first semiconductor layers.

9. The method of claim 1, wherein, in a top view, the gate end dielectric layer is disposed between the gate sidewall spacers along the first direction.

10. A method of manufacturing a semiconductor device, comprising:

forming a first fin structure in which first semiconductor layers and second semiconductor layers are alternately stacked over a first bottom fin structure protruding from a substrate;

forming a second fin structure in which third semiconductor layer and forth semiconductor layers are alternately stacked over a second bottom fin structure protruding from the substrate;

forming a sacrificial gate structure over the first fin structure and the second fin structure;

etching a first source/drain region of the first fin structure and a second source/drain region of the second fin structure, which are not covered by the sacrificial gate structure, thereby forming a first source/drain space over the first fin structure and a second source/drain space over the second fin structure;

laterally etching the first semiconductor layers through the first source/drain space and the third semiconductor layers through the second source/drain space;

forming a first inner spacer made of a dielectric material on an end of each of the etched first semiconductor layers and a second inner spacer made of the dielectric material on an end of each of the etched third semiconductor layers;

forming one or more epitaxial layers in the first source/drain space and the second source/drain space;

removing the sacrificial gate structure, thereby forming a gate space;

removing parts of the first semiconductor layers and parts of the third semiconductor layers in the gate space, thereby leaving first channel regions constituted by the second semiconductor layers and second channel regions constituted by the fourth semiconductor layers;

forming a gate dielectric layer to wrap around each of the second semiconductor layers and each of the fourth semiconductor layers in the gate space, the gate dielectric layer interfacing top surfaces of the first bottom fin structure and the second bottom fin structure;

forming a first gate electrode over the gate dielectric layer above the second semiconductor layers and a second gate electrode over the gate dielectric layer above the fourth semiconductor layers, wherein a composition of the first gate electrode is different from a composition of the second gate electrode, wherein the first gate electrode interfaces the second gate electrode; and forming a gate contact on the first gate electrode, wherein the gate contact is closer to the second semiconductor layers than the fourth semiconductor layers, wherein a thickness of a bottommost one of the first semiconductor layers is greater than a thickness of the first semiconductor layers other than the bottommost one of the first semiconductor layers, wherein the forming of the first gate electrode forms a bottom channel length G2 with respect to the first bottom fin structure and an upper channel length G1 with respect to the first semiconductor layers, wherein the bottom channel length G2 is greater than the upper channel length G1.

11. The method of claim 10, wherein G2/G1 is in a range from 1.05 to 1.4.

12. The method of claim 10, wherein a part of the first gate electrode disposed between a bottommost one of the second semiconductor layers and the top surface of the first bottom fin structure has a tapered shape in a cross section.

13. The method of claim 12, wherein a bottom width of the tapered shape is 1.05 to 1.4 times a top width of the tapered shape.

14. The method of claim 10, further comprising:

forming a first gate end dielectric layer adjacent the first gate electrode;

forming a second gate end dielectric layer adjacent the second gate electrode; and recessing the first gate electrode and the second gate electrode such that top surfaces of the first gate end dielectric layer and the second gate end dielectric layer are higher than top surfaces of the first gate electrode and the second gate electrode, wherein a planar channel region is formed at the bottom fin structure.

15. The method of claim 10, wherein the first source/drain space penetrates the first bottom fin structure by an amount of 5 nm to 35 nm.

16. The method of claim 10, further comprising:

forming a gate spacer along sidewalls of the sacrificial gate structure, wherein a dielectric constant of the first inner spacer is greater than a dielectric constant of the gate spacer.

17. A method of manufacturing a semiconductor device, comprising:

forming a fin structure in which first semiconductor layers and second semiconductor layers are alternately stacked over a bottom fin structure protruding from a substrate, the fin structure extending lengthwise along a first direction;

forming a sacrificial gate structure over the fin structure, the sacrificial gate structure including a sacrificial gate electrode and a sacrificial gate dielectric layer and extending lengthwise along a second direction perpendicular to the first direction;

forming gate sidewall spacers along sidewall of the sacrificial gate structure;

etching a source/drain region of the fin structure, which is not covered by the sacrificial gate structure, thereby forming a source/drain space;

laterally etching the first semiconductor layers through the source/drain space;

forming an inner spacer made of a dielectric material on an end of each of the etched first semiconductor layers;

forming one or more epitaxial layers in the source/drain space;

depositing an etch stop layer over the one or more epitaxial layers;

forming an interlayer dielectric layer over the etch stop layer;

removing the sacrificial gate electrode and the sacrificial gate dielectric layer, thereby forming a gate space;

recessing the gate sidewall spacers;

removing parts of the first semiconductor layers in the gate space, thereby leaving channel regions constituted by the second semiconductor layers;

forming a gate dielectric layer to wrap around each of the second semiconductor layers in the gate space;

forming a gate electrode over the gate dielectric layer, wherein:

a planar channel region is formed at the bottom fin structure, and a channel length of the planar channel region is greater than a channel length of each of the channel regions constituted by the second semiconductor layers;

after the forming of the gate electrode, forming a gate end dielectric layer to interface the gate electrode along the second direction, recessing the gate dielectric layer, the gate electrode and the gate sidewall spacers to form a gate recess;

depositing a cap dielectric layer over the gate recess; and planarizing the cap dielectric layer such that top surfaces of the cap dielectric layer, the etch stop layer, and the interlayer dielectric layer are coplanar, wherein a dielectric constant of the inner spacer is greater than a dielectric constant of the gate sidewall spacers.

18. The method of claim 17, wherein a vertical length of the recessed gate sidewall spacer is greater than a vertical length of the inner spacer.

19. The method of claim 17, wherein a thickness S2 of a bottommost one of the first semiconductor layers is greater than a thickness S1 of the first semiconductor layers other than the bottommost one of the first semiconductor layers.

20. The method of claim 19, wherein S2/S1 is in a range from 1.05 to 1.3.

* * * * *